US012755946B2

(12) United States Patent
Arakawa et al.

(10) Patent No.: US 12,755,946 B2
(45) Date of Patent: Oct. 6, 2026

(54) SEMICONDUCTOR MANUFACTURING APPARATUS AND SEMICONDUCTOR DEVICE MANUFACTURING METHOD

(71) Applicant: Kioxia Corporation, Tokyo (JP)

(72) Inventors: Shohei Arakawa, Mie Mie (JP); Yuta Osada, Yokkaichi Mie (JP)

(73) Assignee: KIOXIA CORPORATION, Tokyo (JP)

(*) Notice: Subject to any disclaimer, the term of this patent is extended or adjusted under 35 U.S.C. 154(b) by 545 days.

(21) Appl. No.: 18/171,992

(22) Filed: Feb. 21, 2023

(65) Prior Publication Data

US 2024/0096607 A1 Mar. 21, 2024

(30) Foreign Application Priority Data

Sep. 21, 2022 (JP) ................................ 2022-150280

(51) Int. Cl.
*H01L 21/306* (2006.01)
*H01J 37/32* (2006.01)
(Continued)

(52) U.S. Cl.
CPC .. *H01J 37/32862* (2013.01); *H01J 37/32724* (2013.01); *H01J 37/32733* (2013.01); *H01J 37/32752* (2013.01); *H10P 50/267* (2026.01); *H10P 72/7612* (2026.01); *H10P 72/7614* (2026.01); *H10P 72/78* (2026.01); *H01J 2237/3341* (2013.01)

(58) Field of Classification Search
CPC ........... H01J 37/32853; H01J 37/32862; H01J 37/32871; H01J 37/32715; H01J 37/32733; H01J 37/32743; H01J 37/32752; H01J 37/32788; H01J 37/32091; H01L 21/68742; H01L 21/6875; H10P 72/7612; H10P 72/7614
See application file for complete search history.

(56) References Cited

U.S. PATENT DOCUMENTS 5,021,114 A * 6/1991 Saito ..................... C23C 16/517 204/298.37
5,075,256 A 12/1991 Wang et al.
(Continued)

FOREIGN PATENT DOCUMENTS

JP H03-097869 A 4/1991
JP H09-283459 A 10/1997
(Continued)

*Primary Examiner* — Luz L Alejandro Mulero
(74) *Attorney, Agent, or Firm* — Foley & Lardner LLP

(57) ABSTRACT

A semiconductor manufacturing apparatus includes: a chamber including a top plate; a holder provided in the chamber and configured to place a substrate; a high-frequency power source configured to apply high-frequency power to the holder; a gas supply pipe configured to supply a gas to the chamber; a gas discharge pipe configured to discharge a gas from the chamber; and a plurality of lift pins configured to move the substrate in a direction away from the holder to the top plate, which allows tip ends of the lift pins to move from an upper surface of the holder to a position with a first distance, wherein the first distance is equal to or greater than about 70% of a second distance between the upper surface of the holder and the top plate.

3 Claims, 35 Drawing Sheets

(51) Int. Cl.

| | |
|---|---|
| ***H10P 50/26*** | (2026.01) |
| ***H10P 72/76*** | (2026.01) |
| ***H10P 72/78*** | (2026.01) |

(56) References Cited

U.S. PATENT DOCUMENTS

| | | | | |
|---|---|---|---|---|
| 5,304,277 | A * | 4/1994 | Ohara ............... | H01J 37/32688 118/723 MA |
| 5,571,366 | A * | 11/1996 | Ishii .................... | H01J 37/3299 216/60 |
| 6,059,985 | A | 5/2000 | Yoshimura et al. | |
| 6,235,655 | B1 | 5/2001 | Jozaki | |
| 8,006,340 | B2 | 8/2011 | Ikenaga et al. | |
| 10,221,105 | B2 | 3/2019 | Iwasawa et al. | |
| 2003/0147075 | A1* | 8/2003 | Otsuki ................ | C23C 16/4412 356/338 |
| 2005/0000450 | A1* | 1/2005 | Lizuka ............. | H01L 21/68742 118/728 |
| 2005/0051437 | A1* | 3/2005 | Kurashina ........... | H01L 21/2885 257/E21.585 |
| 2009/0314211 | A1* | 12/2009 | Du Bois ........... | H01L 21/68742 118/729 |
| 2011/0132873 | A1 | 6/2011 | Tsujimoto et al. | |
| 2016/0064196 | A1* | 3/2016 | Okita ...................... | H01L 21/78 156/345.53 |
| 2018/0012784 | A1 | 1/2018 | Eto | |
| 2021/0050243 | A1* | 2/2021 | Otsuka .............. | H01L 21/67259 |
| 2021/0074520 | A1 | 3/2021 | Shihommatsu et al. | |

FOREIGN PATENT DOCUMENTS

| | | | | |
|---|---|---|---|---|
| JP | H10-154686 | A | | 6/1998 |
| JP | 2000-164565 | A | | 6/2000 |
| JP | 2002289576 | | * | 10/2002 |
| JP | 2002289576 | A | * | 10/2002 |
| JP | 3822763 | B2 | | 9/2006 |
| JP | 2011-119499 | A | | 6/2011 |
| JP | 5038259 | B2 | | 10/2012 |
| JP | 2014-141390 | A | | 8/2014 |
| JP | 2018-006299 | A | | 1/2018 |
| JP | 2021-039924 | A | | 3/2021 |
| KR | 1020130078809 | | * | 7/2013 |
| KR | 1020130078809 | A | * | 7/2013 |

* cited by examiner

SEMICONDUCTOR MANUFACTURING APPARATUS AND SEMICONDUCTOR DEVICE MANUFACTURING METHOD

CROSS-REFERENCE TO RELATED APPLICATION(S)

This application is based upon and claims the benefit of priority from Japanese Patent Application No. 2022-150280, filed Sep. 21, 2022, the entire contents of which are incorporated herein by reference.

FIELD

Embodiments described herein relate generally to a semiconductor manufacturing apparatus and a semiconductor device manufacturing method.

BACKGROUND

When reactive ion etching is performed on layers including metal elements, byproducts including the metal elements are attached to inner surfaces of chambers. The byproducts attached to the inner surface may disadvantageously generate, for example, particles. Accordingly, it is necessary to remove the byproducts attached to the inner surfaces of the chambers by cleaning.

DETAILED DESCRIPTION

Figure 1:
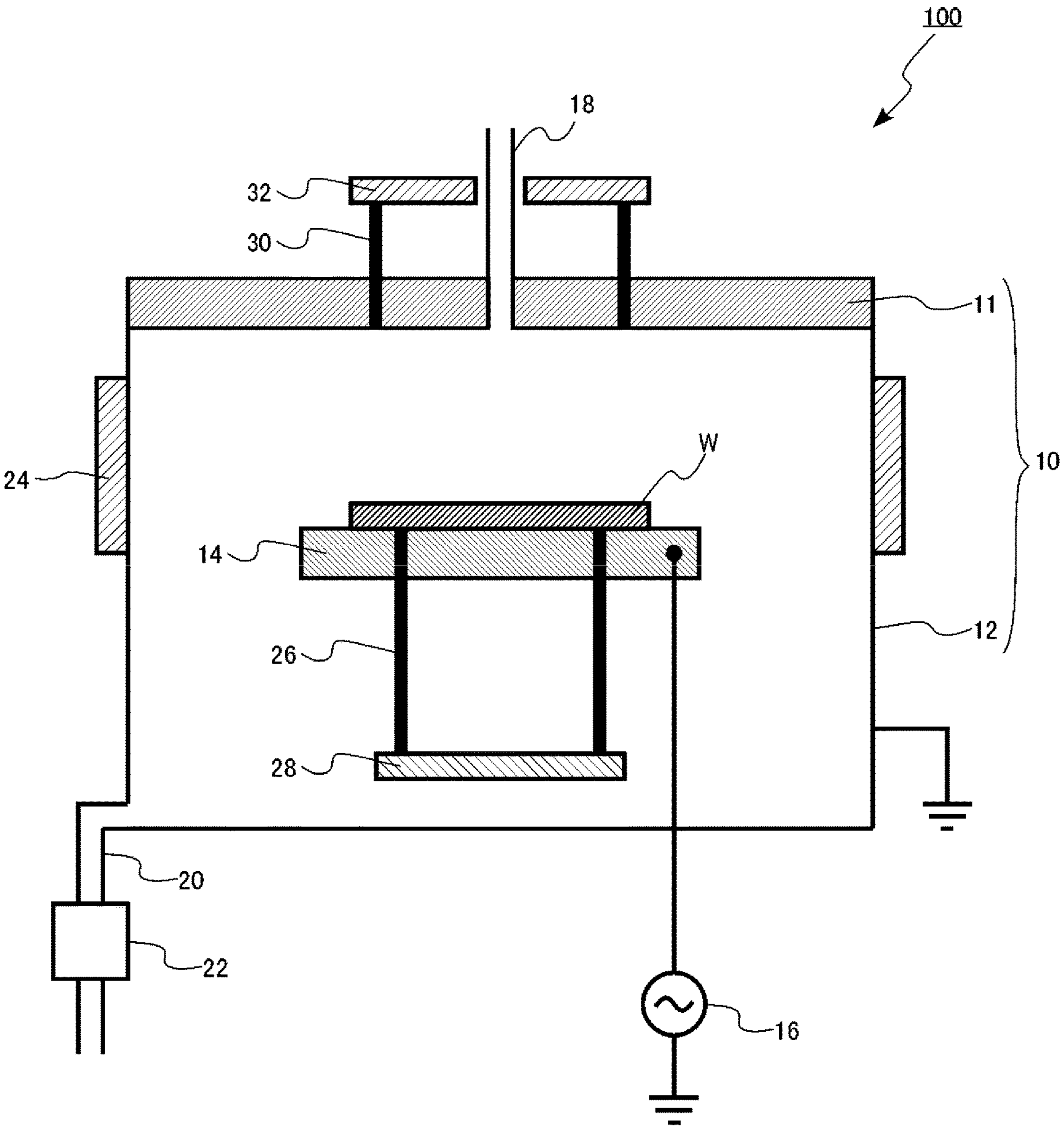
FIG. 1 is a schematic diagram illustrating a semiconductor manufacturing apparatus according to a first embodiment.

Embodiments provide a technology for removing byproducts including metal elements.

In general, according to one embodiment, a semiconductor manufacturing apparatus includes: a chamber including a top plate; a holder provided in the chamber and configured to place a substrate; a high-frequency power source configured to apply high-frequency power to the holder; a gas supply pipe configured to supply a gas to the chamber; a gas discharge pipe configured to discharge a gas from the chamber; and a plurality of lift pins configured to move the substrate in a direction away from the holder to the top plate, which allows tip ends of the lift pins to move from an upper surface of the holder to a position with a first distance, wherein the first distance is equal to or greater than about 70% of a second distance between the upper surface of the holder and the top plate.

Hereinafter, embodiments of the present disclosure will be described with reference to the drawings. Further, in the following description, same or similar members or the like are denoted by the same reference numerals and description of members or the like described once will be appropriately omitted in some cases.

In the present specification, for convenience, a term "above" or "under" is used in some cases. "Above" or "under" is, for example, a term indicating a relative positional relationship in the drawings. The term "above" or "under" is not necessarily a term regulating a positional relationship for gravity.

Hereinafter, a semiconductor manufacturing apparatus and a semiconductor device manufacturing method will be described with reference to the drawings.

First Embodiment

A semiconductor manufacturing apparatus according to a first embodiment includes: a chamber including a top plate and a side wall; a holder provided in the chamber and configured such that a substrate is placed on the holder; a high-frequency power source configured to apply high-frequency power to the holder; a gas supply pipe configured to supply a gas to the chamber; a gas discharge pipe configured to discharge a gas from the chamber; and a plurality of lift pins configured to push up the substrate in a direction orienting from the holder to the top plate and configured such that tip ends of the lift pins are able to move from an upper surface of the holder to a position of 70% or more of a distance between the holder and the top plate.

FIG. 1 is a schematic diagram illustrating a semiconductor manufacturing apparatus according to the first embodiment. The semiconductor manufacturing apparatus according to the first embodiment is a reactive ion etching apparatus (RIE apparatus). The reactive ion etching apparatus according to the first embodiment is a capacitively coupled plasma apparatus (CCP apparatus).

An RIE apparatus 100 according to the first embodiment includes, for example, a chamber 10, a holder 14, a high-frequency power source 16, a gas supply pipe 18, a gas discharge pipe 20, an exhaust device 22, a heater 24, a plurality of lift pins 26, a lift pin support plate 28, a plurality of push pins 30, and a push pin support plate 32.

The chamber 10 includes a top plate 11 and a side wall 12.

The top plate 11 is provided in an upper portion of the chamber 10. The top plate 11 functions as, for example, an upper electrode. The top plate 11 is formed of, for example, a metal.

The side wall 12 surrounds around the holder 14. The side wall 12 is formed of, for example, a metal. For example, the side wall 12 is grounded.

The holder 14 is provided in the chamber 10. For example, a semiconductor wafer W is placed on the holder 14. The semiconductor wafer W is an example of a substrate.

The holder 14 includes, for example, an electrostatic chuck (not illustrated) on an upper surface. The holder 14 adsorbs the semiconductor wafer W using, for example, the electrostatic chuck.

The holder 14 functions as a lower electrode. High-frequency power is applied to the holder 14. The holder 14 is formed of, for example, a metal.

For example, a heater (not illustrated) is provided in the holder 14. The semiconductor wafer W placed on the holder 14 can be heated by the heater.

The high-frequency power source 16 functions to apply high-frequency power to the holder 14. The high-frequency power source 16 is connected to the holder 14. With the high-frequency power applied to the holder 14 by the high-frequency power source 16, plasma can be generated in the chamber 10.

The gas supply pipe 18 is provided, for example, in an upper portion of the chamber 10. A gas is supplied from the gas supply pipe 18 to the chamber 10.

For example, an etching gas or a cleaning gas can be supplied from the gas supply pipe 18. The etching gas is used, for example, to etch a processed layer formed in the semiconductor wafer W. The cleaning gas is used to remove byproducts generated in the etching of the processed layer.

The gas discharge pipe 20 is provided in a lower portion of the chamber 10. For example, an unconsumed etching gas, an unconsumed cleaning gas, or a reaction product is discharged outside of the chamber 10 from the gas discharge pipe 20.

The exhaust device 22 is connected to the gas discharge pipe 20. The exhaust device 22 is, for example, a vacuum pump.

The plurality of lift pins 26 have a function of pushing up a substrate placed on the holder 14 in the direction orienting from the holder 14 to the top plate 11. The lower ends of the plurality of lift pins 26 are fixed to, for example, the lift pin support plate 28. For example, the plurality of lift pins 26 penetrate through the holder 14.

Figure 2:
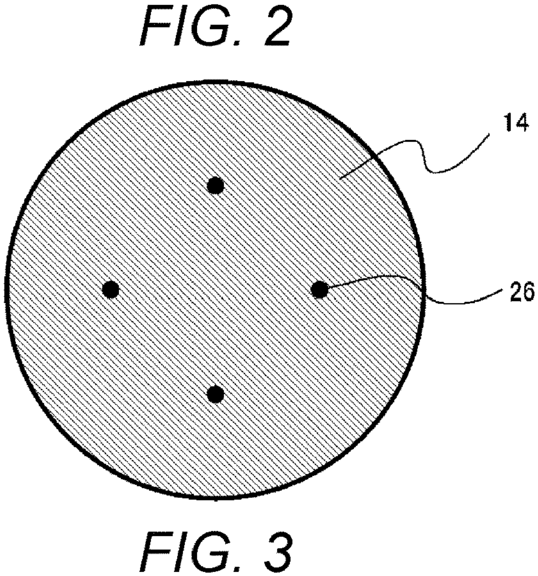
FIG. 2 is a top view illustrating a holder of the semiconductor manufacturing apparatus according to the first embodiment.
Figure 3:
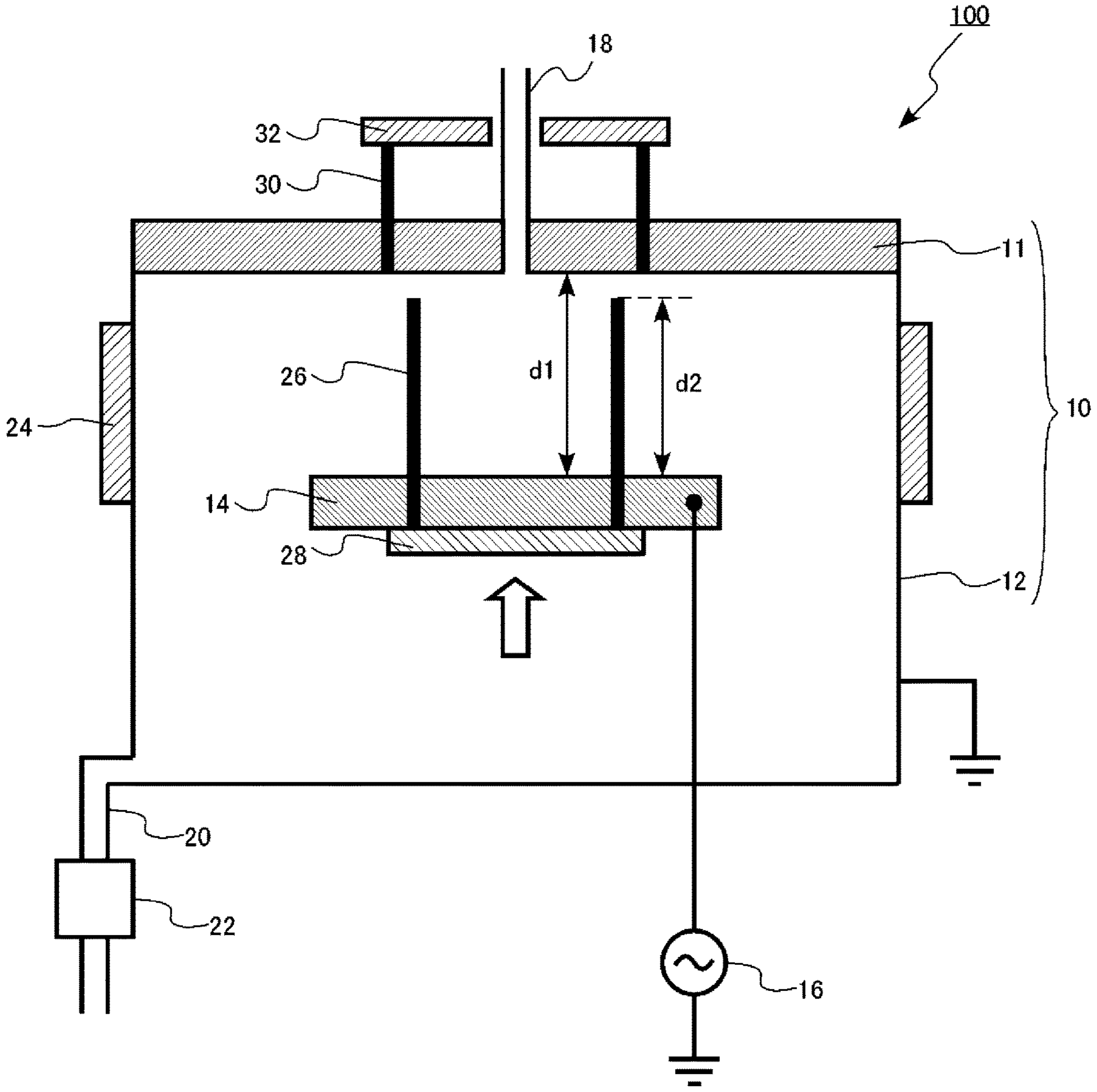
FIG. 3 is a diagram illustrating an operation of lift pins of the semiconductor manufacturing apparatus according to the first embodiment.

FIG. 2 is a top view illustrating the holder of the semiconductor manufacturing apparatus according to the first embodiment. FIG. 3 is a diagram illustrating an operation of the lift pins of the semiconductor manufacturing apparatus according to the first embodiment.

As illustrated in FIG. 2, for example, four lift pins 26 penetrate through the holder 14. The number of lift pins 26 is, for example, four or more. The number of lift pins 26 may be, for example, three. The lift pins 26 may fit in the holder 14 without penetrating through the holder 14.

As illustrated in FIG. 3, the lift pins 26 can be moved in the direction orienting from the holder 14 to the top plate 11.

For example, the lift pin support plate 28 is driven using a driving mechanism (not illustrated) so that the lift pins 26 can move up and down.

FIG. 3 illustrates a state in which the lift pins 26 are closest to the top plate 11. A distance from the upper surface of the holder 14 to the tip end of the lift pin 26 (d2 in FIG. 3) is 70% or more of a distance between the holder 14 and the top plate 11 (d1 in FIG. 3). In other words, the tip end of the lift pin 26 can move from the upper surface of the holder 14 to a position of 70% or more of the distance d1 between the holder 14 and the top plate 11.

The plurality of push pins 30 have a function of pushing down the substrate in a direction orienting from the top plate 11 to the holder 14. The upper ends of the plurality of push pins 30 are fixed to the push pin support plate 32. The plurality of push pins 30 penetrate through, for example, the top plate 11.

Figure 4:
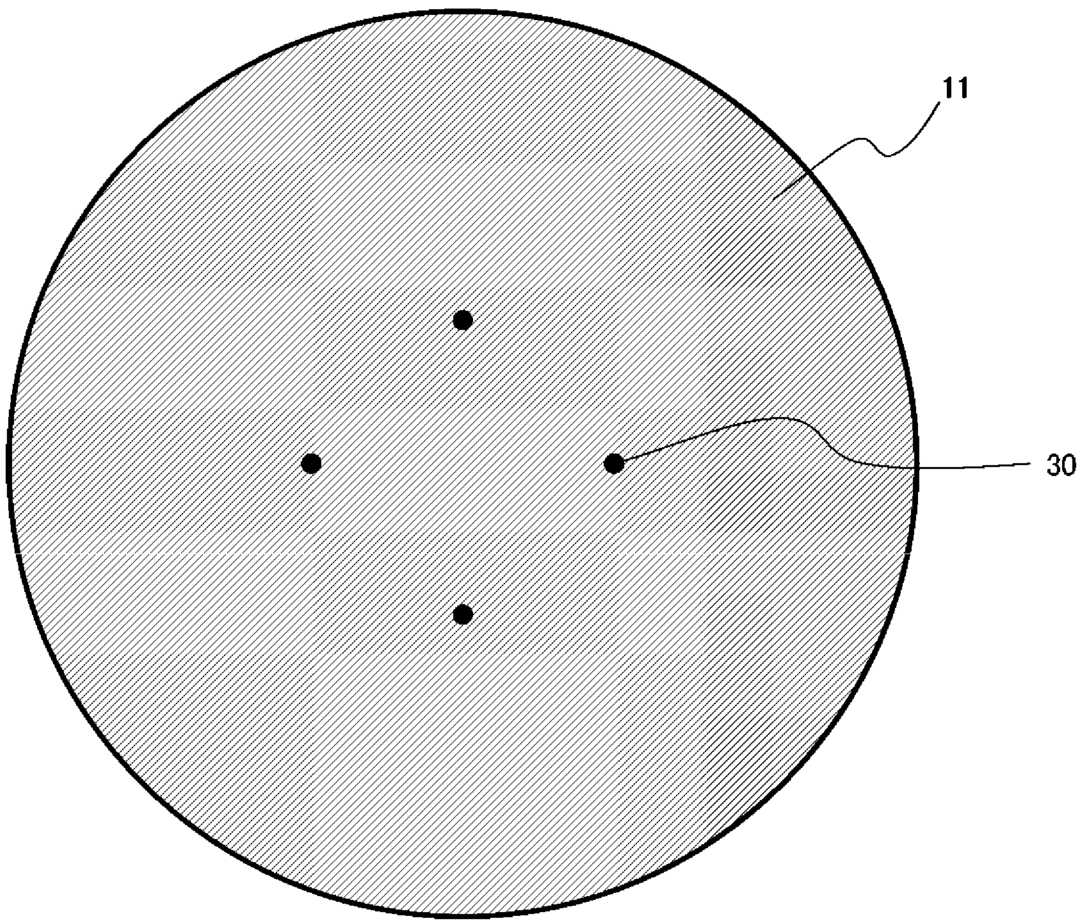
FIG. 4 is a bottom view illustrating a top plate of the semiconductor manufacturing apparatus according to the first embodiment.
Figure 5:
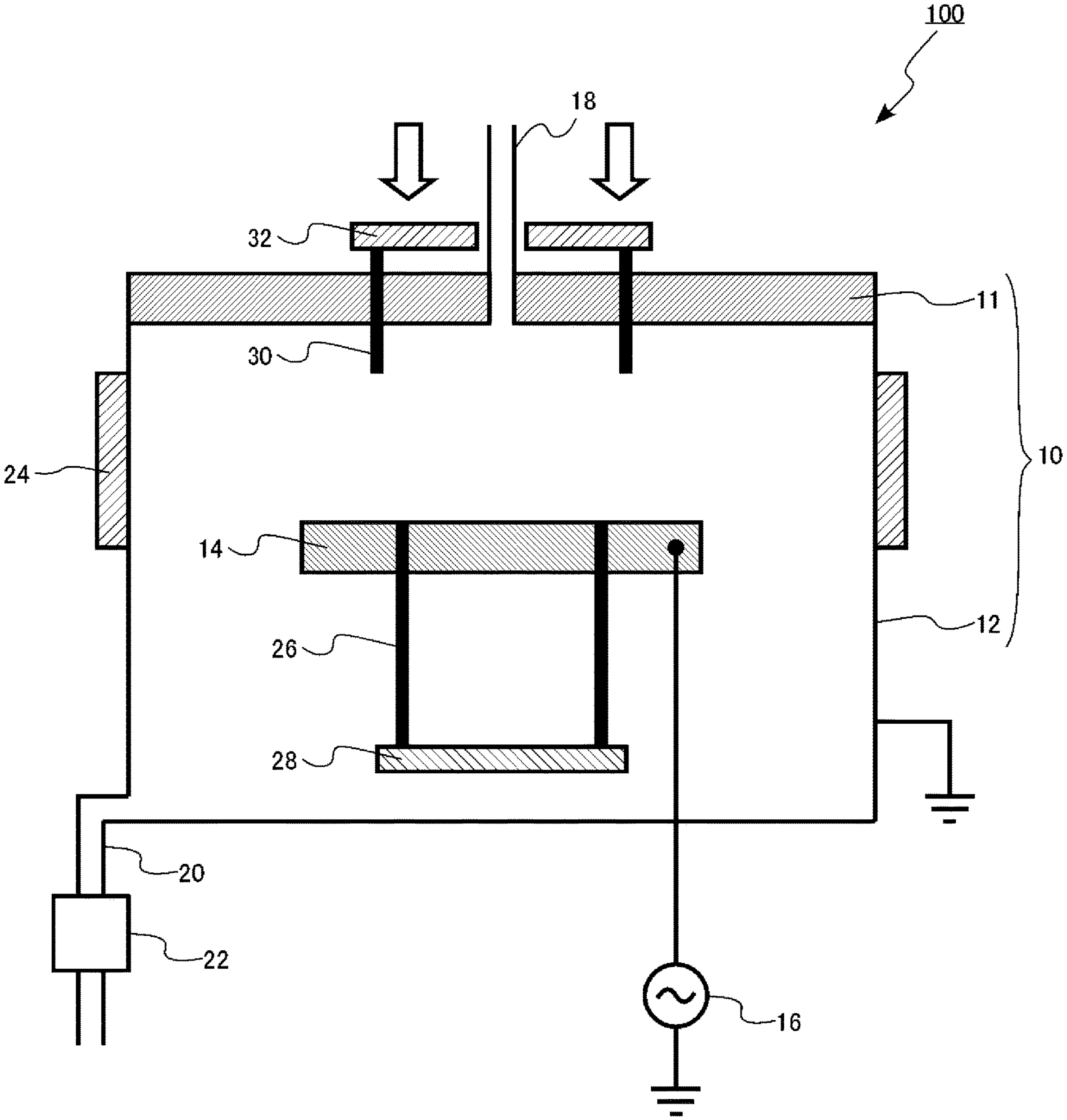
FIG. 5 is a diagram illustrating an operation of push pins of the semiconductor manufacturing apparatus according to the first embodiment.

FIG. 4 is a bottom view illustrating the top plate of the semiconductor manufacturing apparatus according to the first embodiment. FIG. 5 is a diagram illustrating an operation of the push pins of the semiconductor manufacturing apparatus according to the first embodiment.

As illustrated in FIG. 4, for example, four push pins 30 penetrate through the top plate 11. The number of push pins 30 is, for example, four or more. The number of push pins 30 may be, for example, three. The push pins 30 may fit in the top plate 11 without penetrating through the top plate 11.

As illustrated in FIG. 5, the push pins 30 can move in the direction orienting from the top plate 11 to the holder 14. For example, the push pin support plate 32 is driven using a driving mechanism (not illustrated) so that the push pins 30 can move vertically.

For example, the semiconductor wafer W placed on the holder 14 is subjected to anisotropic etching using plasma generated between the top plate 11 and the holder 14 in the chamber 10.

Next, a semiconductor device manufacturing method performed using the semiconductor manufacturing apparatus according to the first embodiment will be described. The semiconductor device manufacturing method according to the first embodiment includes etching by reactive ion etching on a layer containing a metallic element and a method of removing a byproduct generated in the etching.

The semiconductor device manufacturing method according to the first embodiment includes: importing a first substrate that includes a first layer containing indium (In) in a chamber of a reactive ion etching apparatus that includes the chamber including a top plate and a side wall and a holder provided in the chamber; placing the first substrate on the holder; performing an etching process of etching the first layer; exporting the first substrate outside of the chamber; importing a second substrate that includes a resin layer on a surface of the second substrate in the chamber after exporting the first substrate outside of the chamber; placing the second substrate on the holder; heating the second substrate; moving the second substrate in a direction orienting from the holder to the top plate and bringing the resin layer into contact with the top plate; cooling the second substrate; isolating the resin layer from the top plate; and exporting the second substrate outside of the chamber.

FIGS. 6, 7, 8, 9, 10, and 11 are diagrams illustrating examples of a semiconductor device manufacturing method according to the first embodiment.

First, the semiconductor wafer W including the first layer containing indium (In) is imported in the chamber 10 of the RIE apparatus 100. The semiconductor wafer W is an example of the first substrate. The semiconductor wafer W is, for example, a silicon substrate.

The first layer contains, for example, indium (In), tin (Sn), and oxygen (O). The first layer is, for example, an indium tin oxide layer. The first layer contains, for example, indium (In), gallium (Ga), zinc (Zn), and oxygen (O). The first layer is, for example, an indium gallium zinc oxide layer.

The imported semiconductor wafer W is placed on the holder 14 in the chamber 10.

Figure 6:
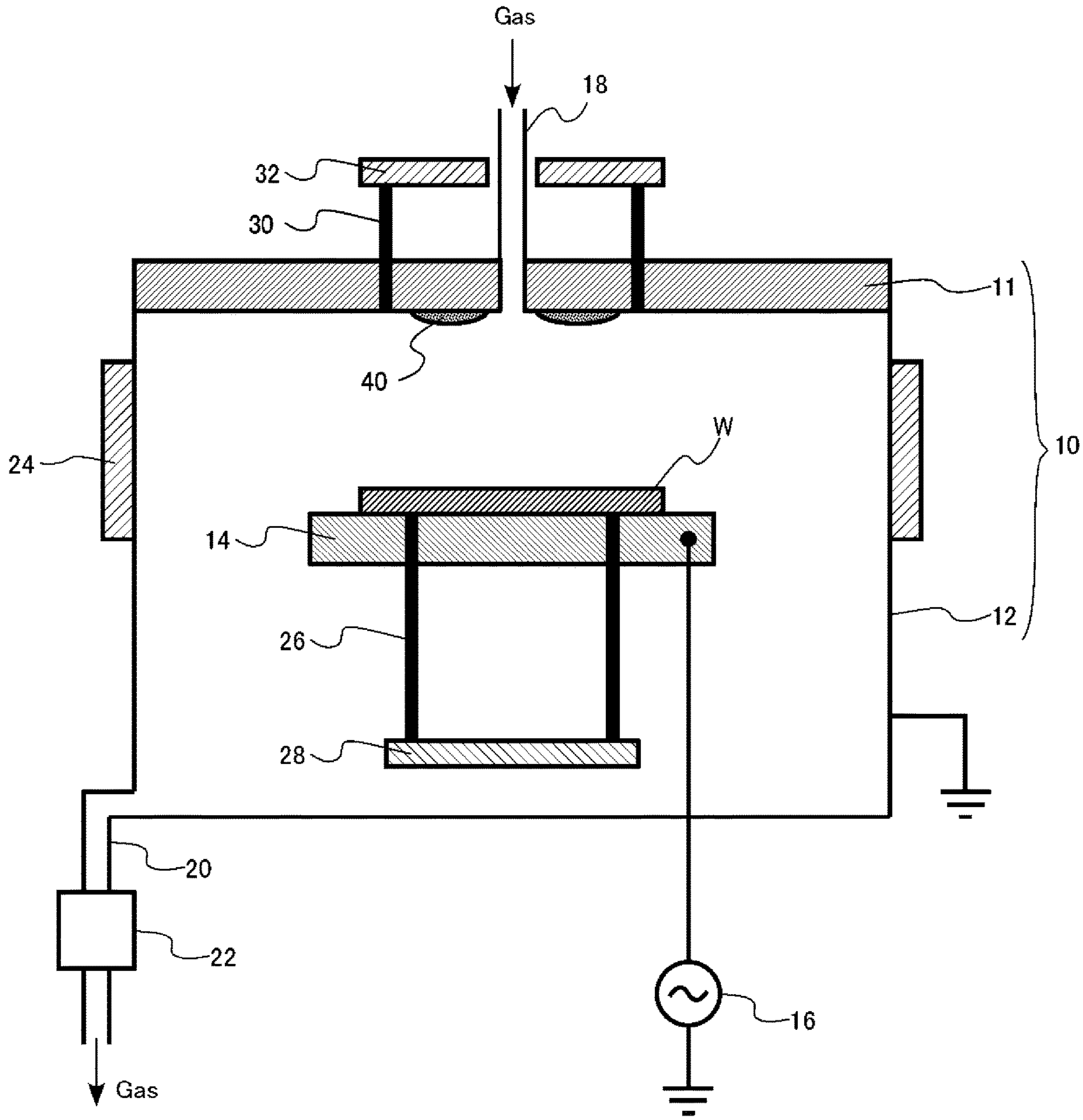
FIG. 6 is a diagram illustrating an example of a semiconductor device manufacturing method according to the first embodiment.
Figure 7:
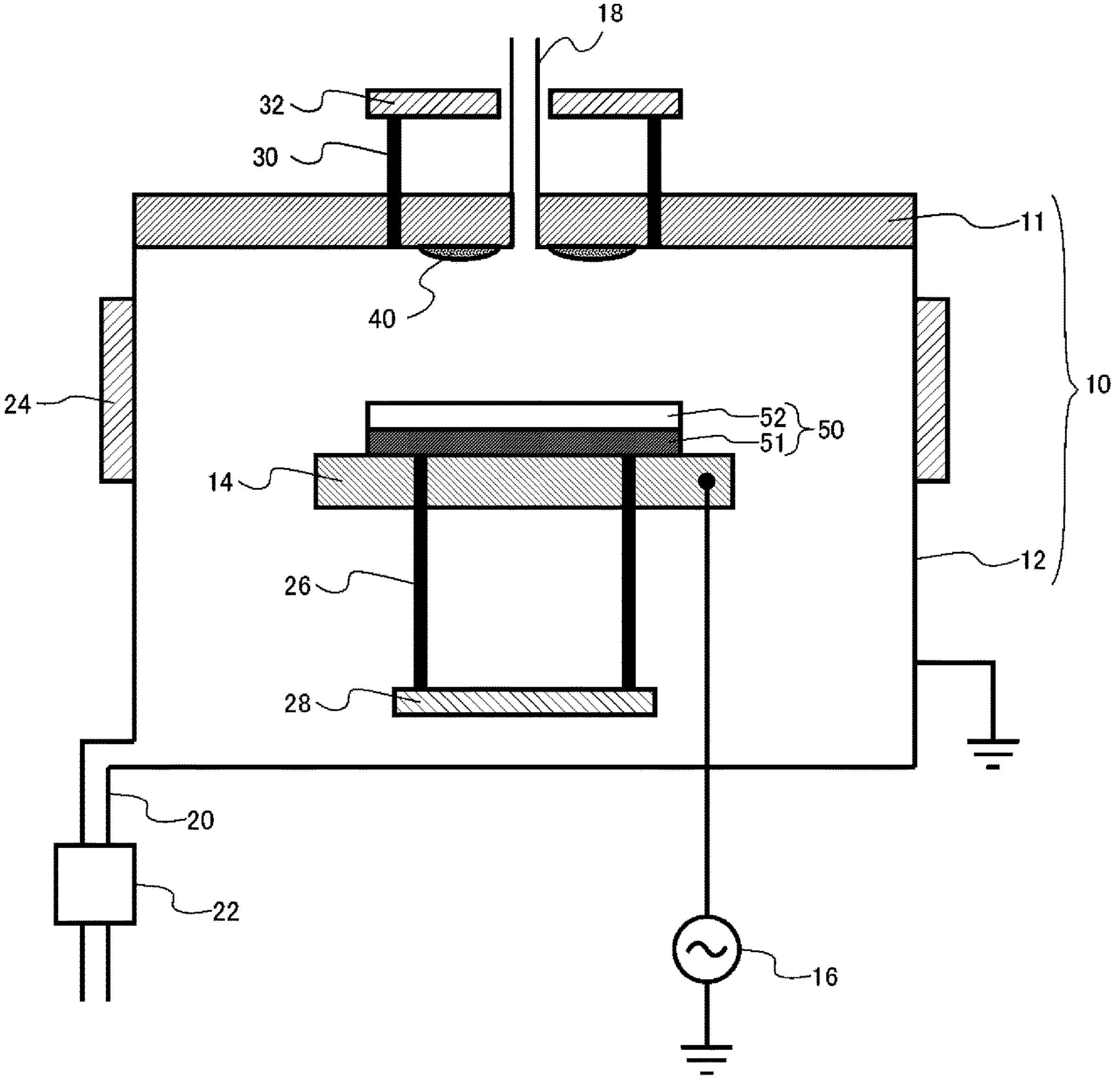
FIG. 7 is a diagram illustrating an example of the semiconductor device manufacturing method according to the first embodiment.
Figure 8:
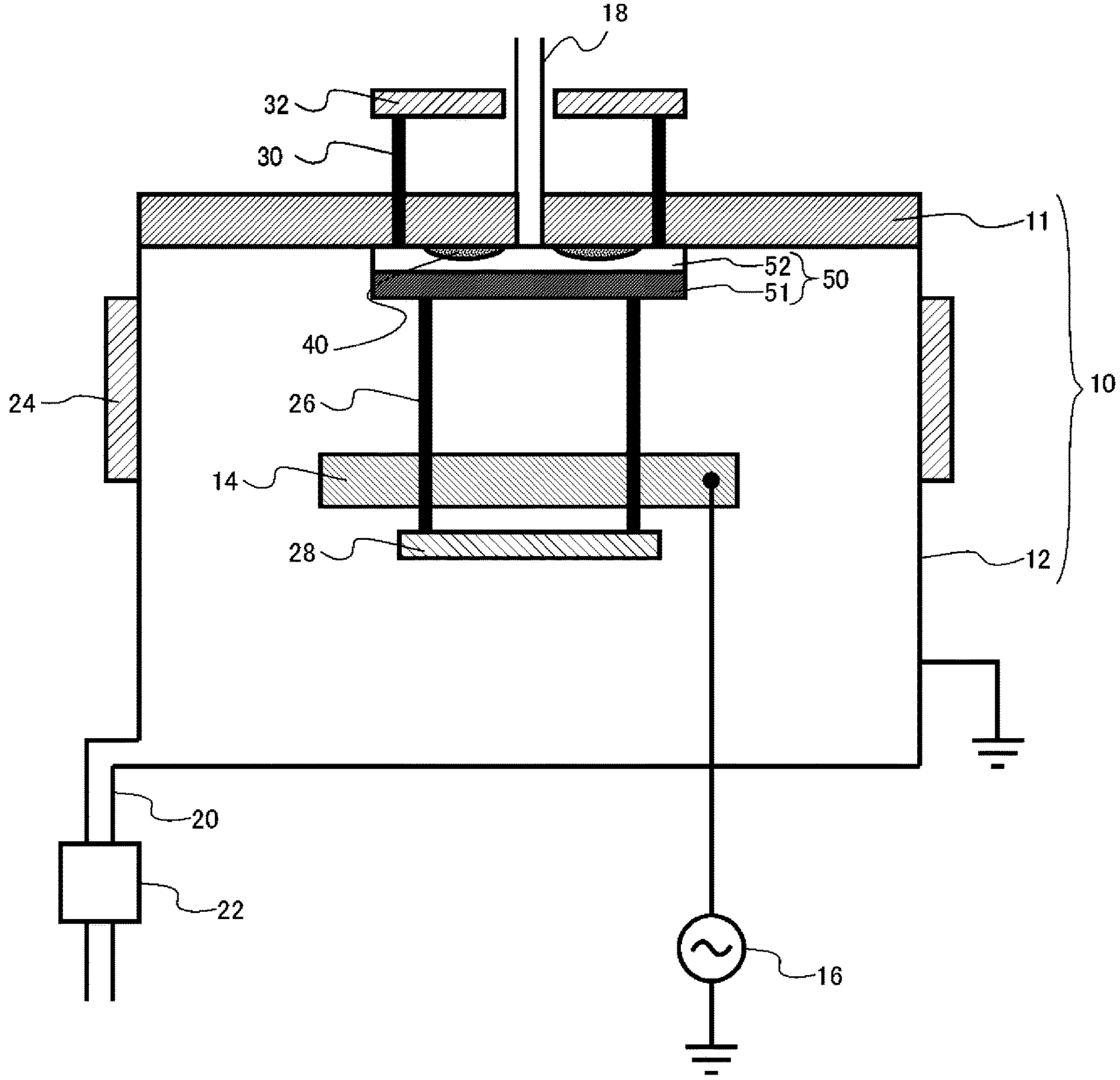
FIG. 8 is a diagram illustrating an example of the semiconductor device manufacturing method according to the first embodiment.

Subsequently, an etching process of etching the first layer is performed (see FIG. 6). For example, a methane gas ($CH_4$) and a hydrogen gas ($H_2$) are supplied as an etching gas from the gas supply pipe 18 in the chamber 10. The exhaust device 22 is operated to depressurize a pressure in the chamber 10 and maintain a predetermined pressure. For example, a gas containing fluorine (F) may also be used as the etching gas.

Subsequently, the high-frequency power source 16 applies high-frequency power to the holder 14. The high-frequency power source 16 generates plasma in the chamber 10 by the high-frequency power applied to the holder 14. Ions or radicals in the plasma collide with the semiconductor wafer W to etch the first layer.

Subsequently, the application of the high-frequency power to the holder 14 is stopped and the supply of the etching gas is stopped. The etching process ends. After the etching process ends, the semiconductor wafer W is exported outside of the chamber 10.

In the etching process, a byproduct 40 containing indium (In) is attached to the lower surface of the top plate 11. The byproduct 40 containing indium is, for example, an oxide. When the etching gas contains fluorine (F), the byproduct 40 containing indium is, for example, a fluoride.

For example, the importing of the semiconductor wafer W including the first layer containing indium (In) in the chamber 10, the etching of the first layer, and the exporting of the semiconductor wafer W outside of the chamber 10 are repeated a plurality of times.

Subsequently, a cleaning substrate 50 is imported in the chamber 10. The cleaning substrate 50 is an example of a second substrate or a substrate. The imported cleaning substrate 50 is placed on the holder 14 in the chamber 10 (see FIG. 7).

The cleaning substrate 50 includes a support layer 51 and a resin layer 52. The resin layer 52 is provided on the surface of the support layer 51.

The support layer 51 is, for example, a semiconductor layer or an insulating layer. The support layer 51 is, for example, a silicon layer.

The resin layer 52 contains, for example, a thermoplastic resin. The resin layer 52 is, for example, a thermoplastic resin.

The resin layer 52 contains, for example, a hot-melt adhesive. The resin layer 52 is, for example, a hot-melt adhesive.

A melting point of the resin layer 52 is equal to or less than, for example, 100° C.

The resin layer 52 contains at least one resin selected from the group consisting of, for example, polyethylene (PE), high density polyethylene (HDPE), polypropylene (PP), polystyrene (PS), polyvinyl acetate (PVAc), polyurethane (PUR), polytetrafluoroethylene (PTFE), acrylonitrile tri-butadiene styrene resin (ABS resin), ethylene-vinyl acetate copolymer (EVA), polyolefin (PO), polyamide (PA), synthetic rubber (SR), acrylic (ACR), and polyurethane (PUR).

Ethylene-vinyl acetate copolymer (EVA), polyolefin (PO), polyamide (PA), synthetic rubber (SR), acrylic (ACR), and polyurethane (PUR) are hot-melt adhesives.

Subsequently, the cleaning substrate 50 is heated. In the heating of the cleaning substrate 50, a heater (not illustrated) provided in the heater 24 or the holder 14 is used.

The resin layer 52 is softened or melted by heating the cleaning substrate 50. The heating of the cleaning substrate 50 is performed at a temperature equal to or greater than 50° C. and equal to or less than 200° C.

Subsequently, the cleaning substrate 50 is moved in the direction orienting from the holder 14 to the top plate 11 using the lift pins 26. The cleaning substrate 50 is lifted by the lift pins 26. The cleaning substrate 50 is brought into contact with the top plate 11 (see FIG. 8).

The softened or melted resin layer 52 incorporates the byproduct 40 containing indium. The resin layer 52 traps the byproduct 40.

Subsequently, the resin layer 52 is cooled. The cooling of the resin layer 52 is performed, for example, by stopping the heating of the heater 24 or natural cooling. When the resin layer 52 is solidified, an adhesive strength of the resin layer 52 and the byproduct 40 is increased.

Figure 9:
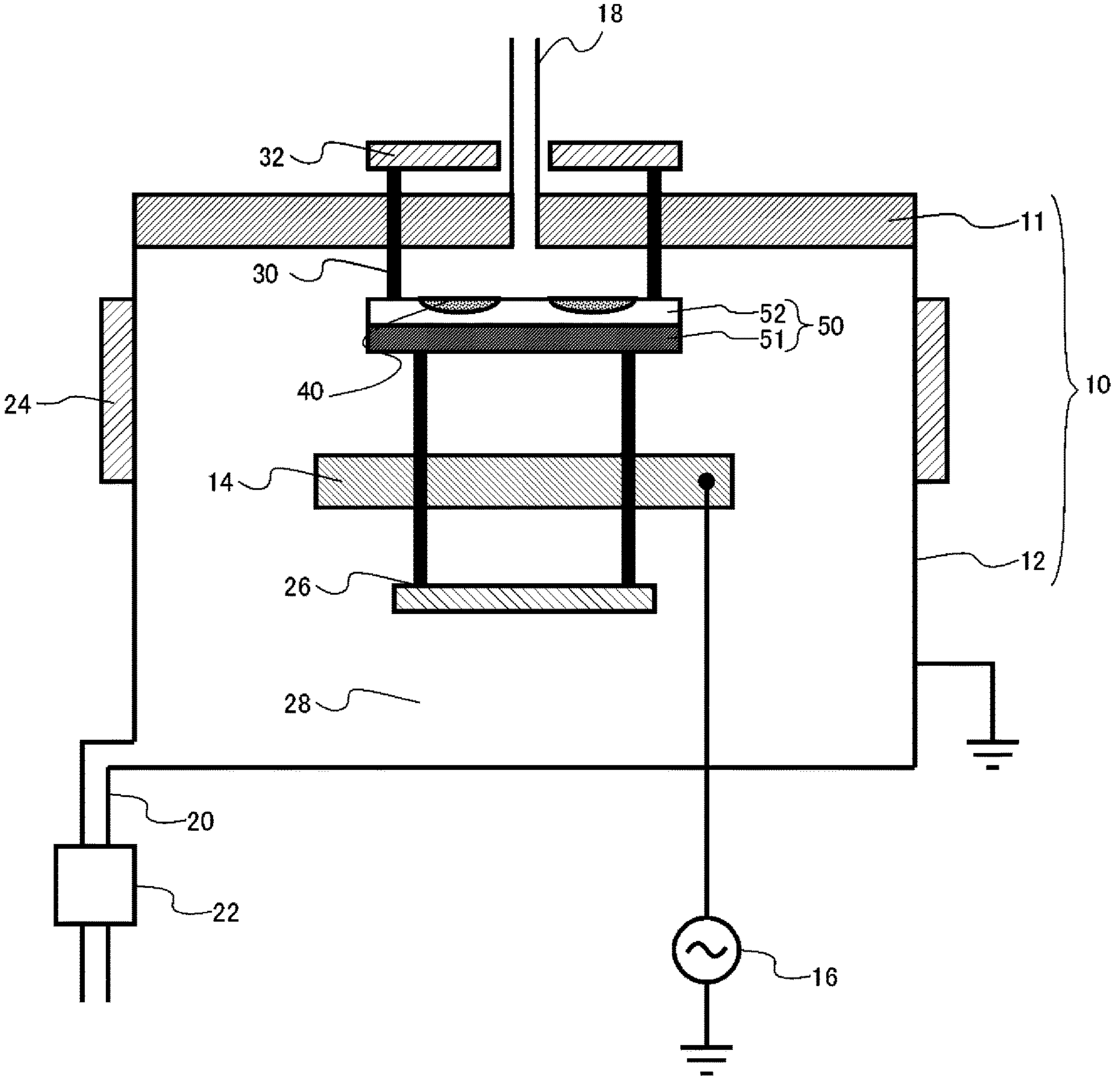
FIG. 9 is a diagram illustrating an example of the semiconductor device manufacturing method according to the first embodiment.

Subsequently, the cleaning substrate 50 is isolated from the top plate 11 (see FIG. 9). The resin layer 52 is isolated from the top plate 11.

The cleaning substrate 50 is moved in the direction orienting from the top plate 11 to the holder 14 using the push pins 30. The cleaning substrate 50 is pushed down with the push pins 30.

The byproduct 40 attached to the resin layer 52 is stripped from the top plate 11. Accordingly, the byproduct 40 containing indium attached to the lower surface of the top plate 11 is removed.

Figure 10:
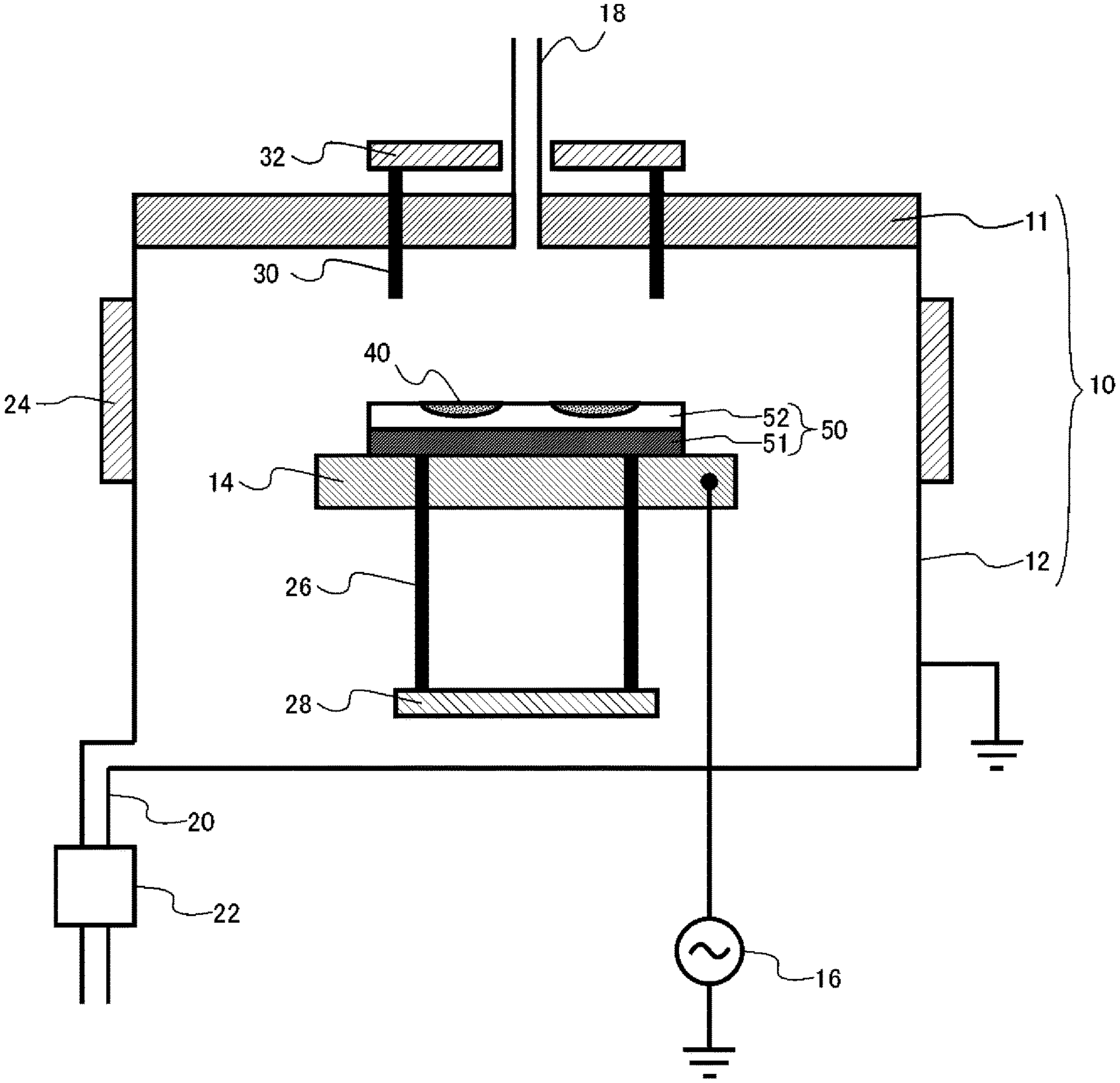
FIG. 10 is a diagram illustrating an example of the semiconductor device manufacturing method according to the first embodiment.

The cleaning substrate 50 trapping the byproduct 40 is moved down using the lift pins 26 and is placed on the holder 14 (see FIG. 10). Thereafter, the cleaning substrate 50 is exported outside of the chamber 10.

Subsequently, a dummy wafer DW is imported in the chamber 10 of the RIE apparatus. The dummy wafer DW is, for example, a silicon substrate. The dummy wafer DW protects, for example, the surface of the electrostatic chuck of the holder 14 in the oxygen plasma processing.

Figure 11:
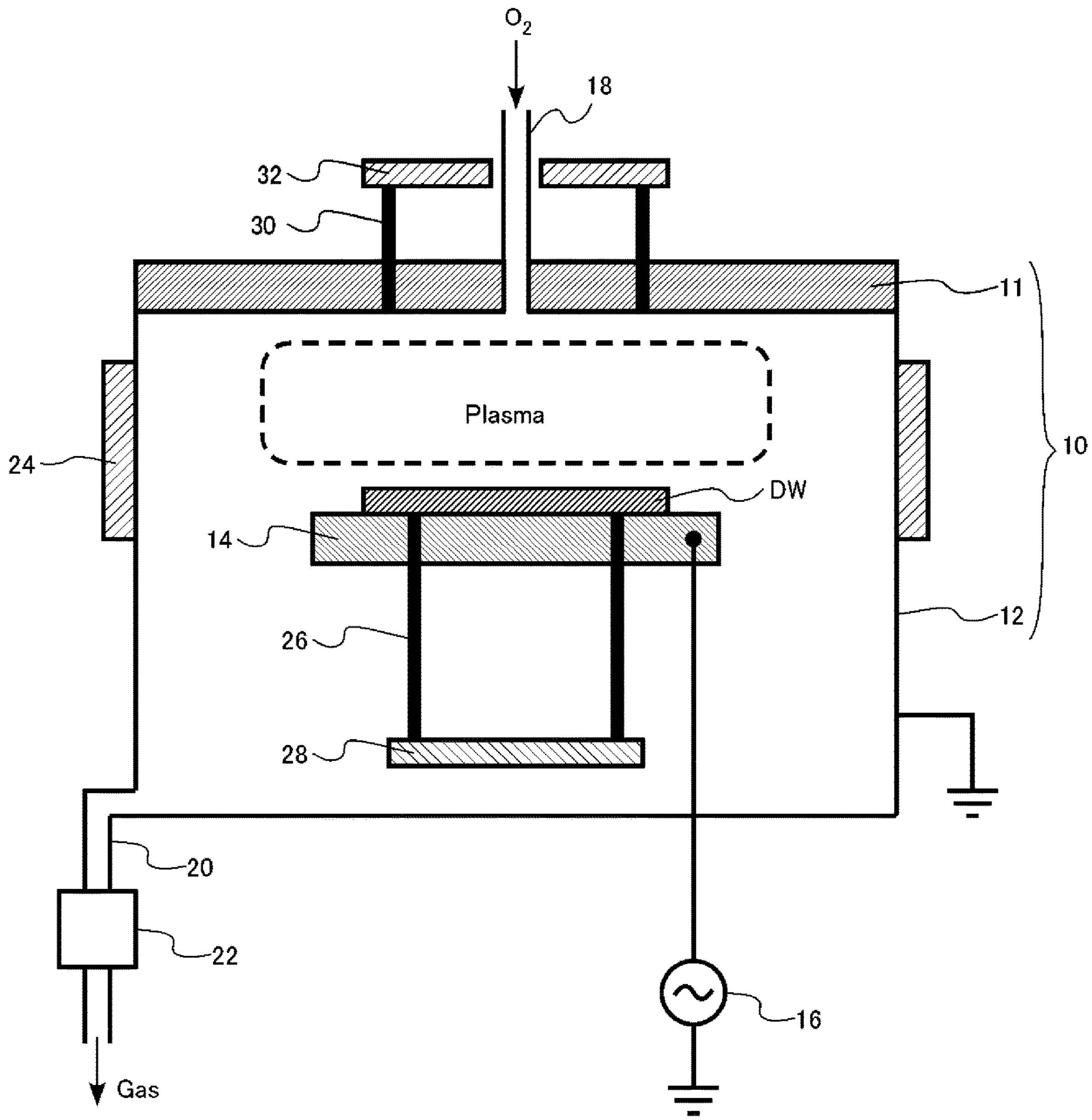
FIG. 11 is a diagram illustrating an example of the semiconductor device manufacturing method according to the first embodiment.

Subsequently, the oxygen plasma processing is performed (see FIG. 11). Supply of an oxygen gas ($O_2$) from the gas supply pipe 18 in the chamber 10 is started. The exhaust device 22 is operated to maintain a pressure in the chamber 10 to a predetermined pressure. When application of the high-frequency power to the holder 14 is started, oxygen plasma is generated.

For example, the resin derived from the resin layer 52 attached to the lower surface of the top plate 11 can be removed with the oxygen plasma.

Next, operational effects and advantages of the semiconductor manufacturing apparatus and the semiconductor device manufacturing method according to the first embodiment will be described.

For example, when a layer containing indium (In) such as an indium tin oxide layer provided in a semiconductor device is etched using the RIE apparatus, a byproduct containing indium (In) is attached to the inner surface of the chamber. The byproduct containing indium is attached to, for example, the lower surface of the top plate of the chamber.

The byproduct attached to the lower surface of the top plate of the chamber is a cause for generating, for example, particles. The particles generated in the chamber deteriorate, for example, a manufacturing yield of semiconductor devices. Accordingly, it is necessary to remove the byproduct attached to the lower surface of the top plate of the chamber periodically. That is, it is necessary to perform a cleaning process on the chamber periodically.

A vapor pressure of the byproduct containing indium is low. In other words, the byproduct containing indium rarely volatilizes. Therefore, for example, to remove the byproduct containing indium by heating, a high temperature equal to or greater than a temperature exceeding resistance of the RIE apparatus is necessary.

Accordingly, for example, a method of opening the chamber and removing the byproduct containing indium by wet etching or the like may also be conceived. However, in this case, a time necessary for the cleaning process becomes longer and a turn-around time for semiconductor device manufacturing increases. Accordingly, for example, manufacturing cost of a semiconductor device is raised.

In the semiconductor manufacturing apparatus and the semiconductor device manufacturing method according to the first embodiment, the byproduct 40 containing indium attached to the lower surface of the top plate 11 of the chamber 10 is trapped by the resin layer 52 of the cleaning substrate 50. By removing the byproduct 40 containing indium using the cleaning substrate 50, it is possible to remove the byproduct 40 containing indium without opening the chamber. Accordingly, for example, the time necessary for the cleaning process becomes shorter and the turn-around time for semiconductor device manufacturing decreases.

In the semiconductor manufacturing apparatus according to the first embodiment, from the viewpoint of reliably bringing the resin layer 52 of the cleaning substrate 50 into contact with the top plate 11, the tip ends of the lift pins 26 can be preferably moved from the upper surface of the holder 14 to a position equal to or greater than 80% of the distance d1 between the holder 14 and the top plate 11, and can be more preferably moved to a position equal to or greater than 90% of the distance d1.

In the semiconductor manufacturing apparatus according to the first embodiment, the number of lift pins 26 is preferably four or more. As the number of lift pins 26 is larger, vertical movement of the cleaning substrate 50 is stabilized.

In the semiconductor manufacturing apparatus according to the first embodiment, the push pins 30 are preferably included. It is easy to isolate the cleaning substrate 50 from the top plate 11. The push pins 30 may be omitted in the apparatus.

In the semiconductor device manufacturing method according to the first embodiment, the resin layer 52 is preferably a thermoplastic resin. It is easy to trap the byproduct 40 by heating and cooling the resin layer 52.

In the semiconductor device manufacturing method according to the first embodiment, the resin layer 52 preferably includes a hot-melt adhesive. Adhesive strength of the resin layer 52 and the byproduct 40 is increased and removal efficiency of the byproduct 40 is increased.

In the semiconductor device manufacturing method according to the first embodiment, a melting point of the resin layer 52 is preferably equal to or less than 100° C. It is easy to trap the byproduct 40 by heating and cooling the resin layer 52.

In the semiconductor device manufacturing method according to the first embodiment, a heating temperature of the cleaning substrate 50 is preferably equal to or greater than 50° C. and equal to or less than 200° C. and more preferably equal to or greater than 70° C. and equal to or less than 100° C. When the heating temperature exceeds the foregoing lower limit, softening or melting of the resin layer 52 is accelerated. When the heating temperature exceeds the foregoing upper limit, excessive melting of the resin layer 52 can be inhibited.

In the semiconductor device manufacturing method according to the first embodiment, the oxygen plasma processing is preferably performed, for example, from the viewpoint of removing a resin remaining on the top plate. A manufacturing method in which the oxygen plasma processing is omitted may also be conceived.

As described above, in the semiconductor manufacturing apparatus and the semiconductor device manufacturing method according to the first embodiment, it is possible to remove the byproduct containing indium without opening the chamber.

Second Embodiment

A semiconductor manufacturing apparatus according to a second embodiment includes: a chamber including a top plate and a side wall; a holder provided in the chamber and configured such that a substrate is placed on the holder; a high-frequency power source configured to apply high-frequency power to the holder; a gas supply pipe configured to supply a gas to the chamber; a gas discharge pipe configured to discharge a gas from the chamber; and a plurality of support members configured to move the substrate in a direction orienting from the holder to the top plate and configured such that tip ends of the support members are able to move in a direction orienting from the side wall to the holder and the tip ends of the support members support a lower surface of the substrate.

Figure 12:
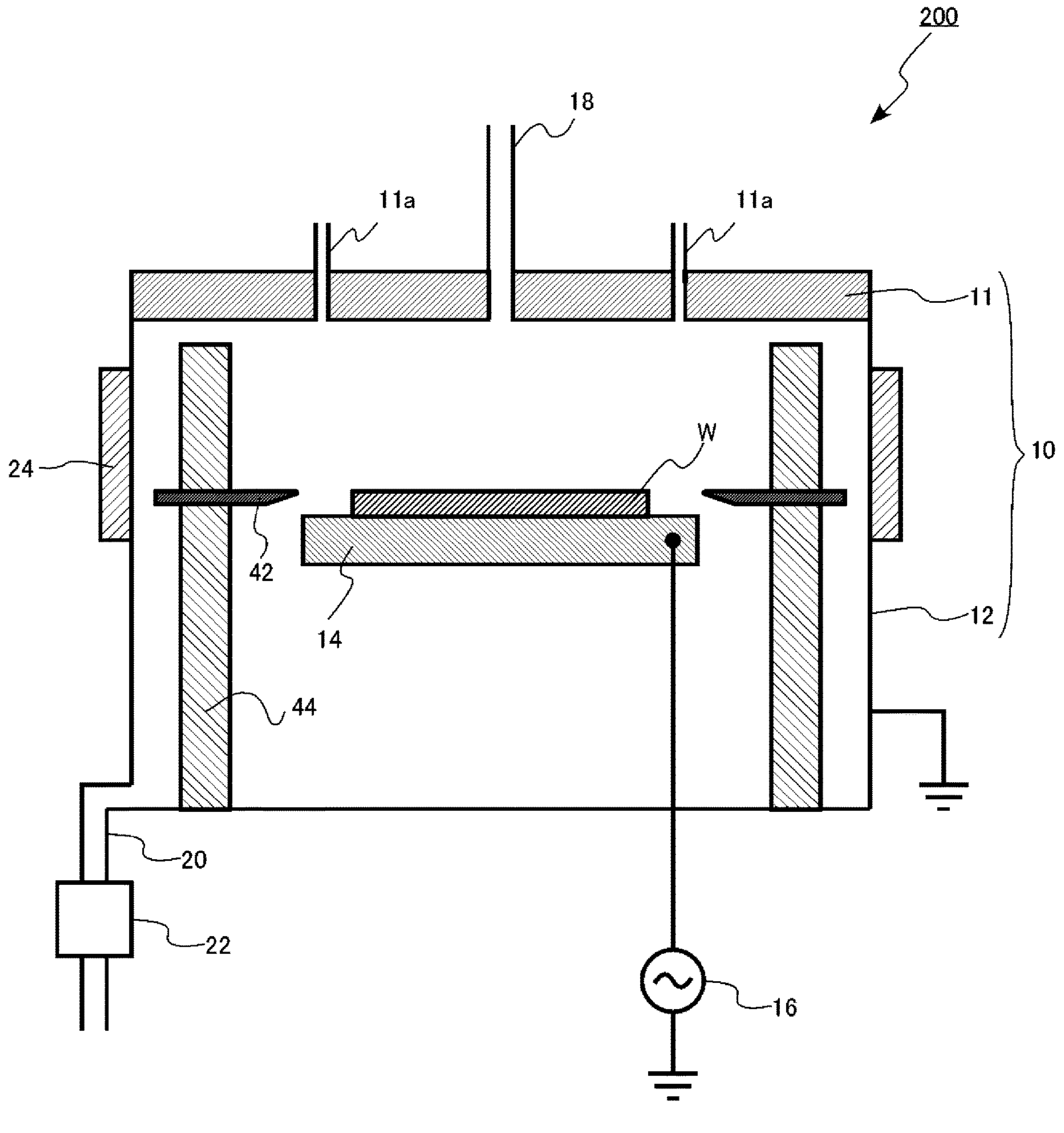
FIG. 12 is a schematic diagram illustrating a semiconductor manufacturing apparatus according to a second embodiment.

FIG. 12 is a schematic diagram illustrating a semiconductor manufacturing apparatus according to the second embodiment. The semiconductor manufacturing apparatus according to the second embodiment is a reactive ion etching apparatus (RIE apparatus). The reactive ion etching apparatus according to the second embodiment is a capacitively coupled plasma apparatus (CCP apparatus).

An RIE apparatus 200 according to the second embodiment includes, for example, a chamber 10, a holder 14, a high-frequency power source 16, a gas supply pipe 18, a gas discharge pipe 20, an exhaust device 22, a heater 24, a plurality of support pins 42, and a plurality of guide rails 44. The support pin 42 is an example of a support member. The guide rail 44 is an example of a guide unit.

The chamber 10 includes a top plate 11 and a side wall 12. The top plate 11 has adsorption holes 11*a*.

The top plate 11 is provided in an upper portion of the chamber 10. The top plate 11 functions as, for example, an upper electrode. The top plate 11 is formed of, for example, a metal.

The side wall 12 surrounds around the holder 14. The side wall 12 is formed of, for example, a metal. For example, the side wall 12 is grounded.

The holder 14 is provided in the chamber 10. For example, a semiconductor wafer W is placed on the holder 14. The semiconductor wafer W is an example of a substrate.

The holder 14 includes, for example, an electrostatic chuck (not illustrated). The holder 14 adsorbs the semiconductor wafer W using, for example, the electrostatic chuck.

The holder 14 functions as a lower electrode. High-frequency power is applied to the holder 14. The holder 14 is formed of, for example, a metal.

For example, a heater (not illustrated) is provided in the holder 14. The semiconductor wafer W placed on the holder 14 can be heated by the heater.

The high-frequency power source 16 functions to apply high-frequency power to the holder 14. The high-frequency power source 16 is connected to the holder 14. With the high-frequency power applied to the holder 14 by the high-frequency power source 16, plasma can be generated in the chamber 10.

The gas supply pipe 18 is provided, for example, in an upper portion of the chamber 10. A gas is supplied from the gas supply pipe 18 to the chamber 10.

For example, an etching gas or a cleaning gas can be supplied from the gas supply pipe 18. The etching gas is used, for example, to etch a processed layer formed in the semiconductor wafer W. The cleaning gas is used to remove byproducts generated in the etching of the processed layer.

The gas discharge pipe 20 is provided in a lower portion of the chamber 10. For example, an unconsumed etching gas, an unconsumed cleaning gas, or a reaction product is discharged outside of the chamber 10 from the gas discharge pipe 20.

The exhaust device 22 is connected to the gas discharge pipe 20. The exhaust device 22 is, for example, a vacuum pump.

The plurality of support pins 42 have a function of moving a substrate placed on the holder 14 in the direction orienting from the holder 14 to the top plate 11. The plurality of support pins 42 are supported by, for example, the guide rails 44.

The guide rails 44 are provided around the holder 14. The guide rails 44 extend in the direction orienting from the holder 14 to the top plate 11. The plurality of support pins 42 are moved along the guide rails 44.

Figure 13:
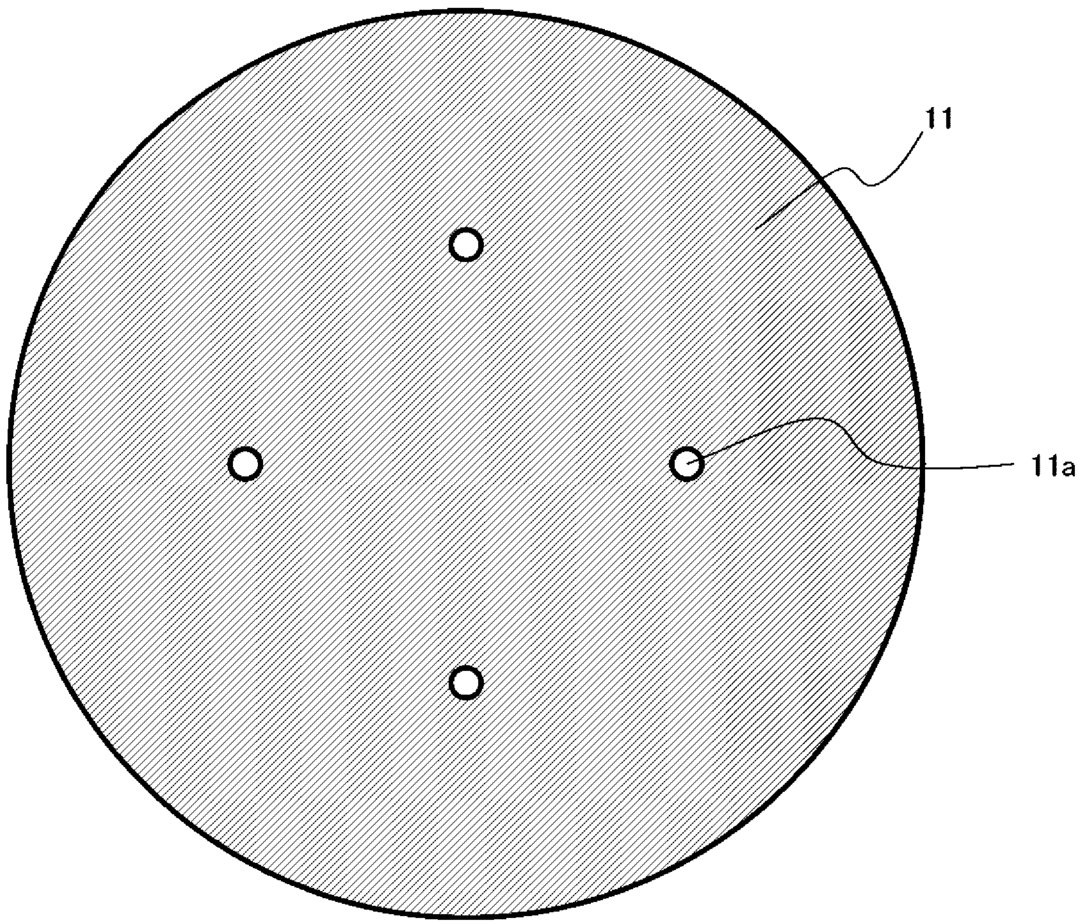
FIG. 13 is a bottom view illustrating a top plate of the semiconductor manufacturing apparatus according to the second embodiment.
Figure 14:
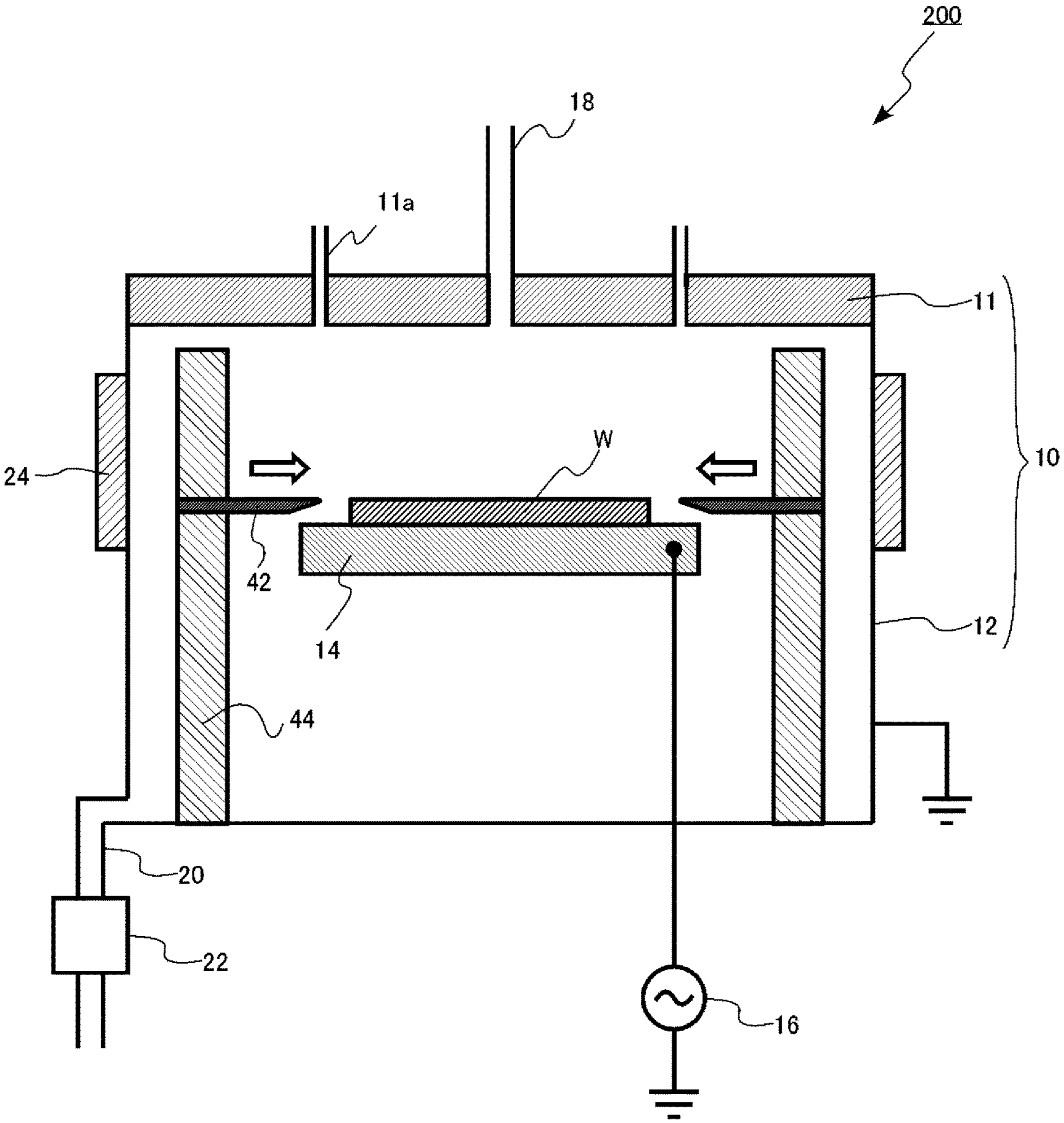
FIG. 14 is a diagram illustrating an operation of a support member of the semiconductor manufacturing apparatus according to the second embodiment.
Figure 15:
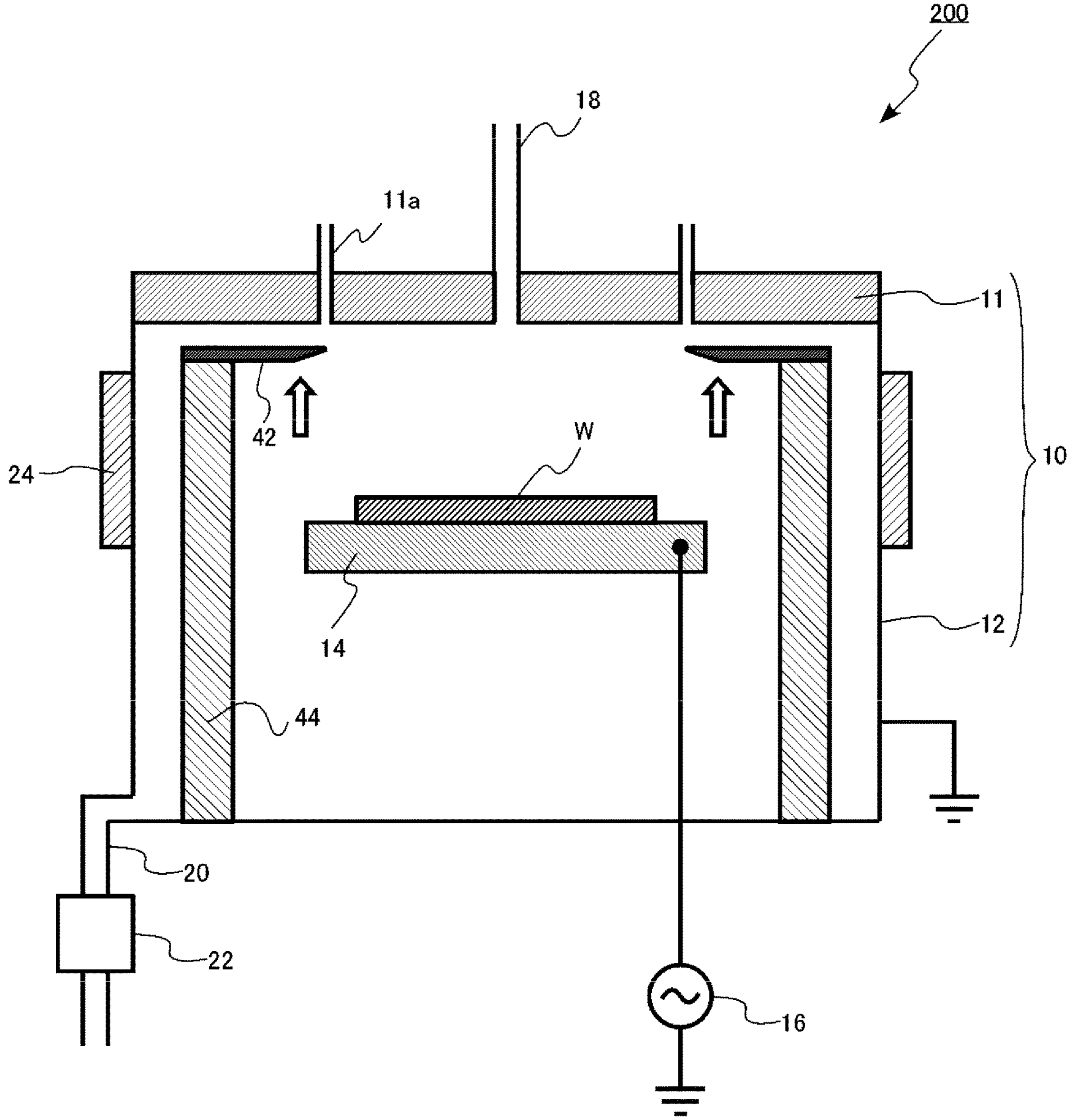
FIG. 15 is a diagram illustrating an operation of the support member of the semiconductor manufacturing apparatus according to the second embodiment.
Figure 16:
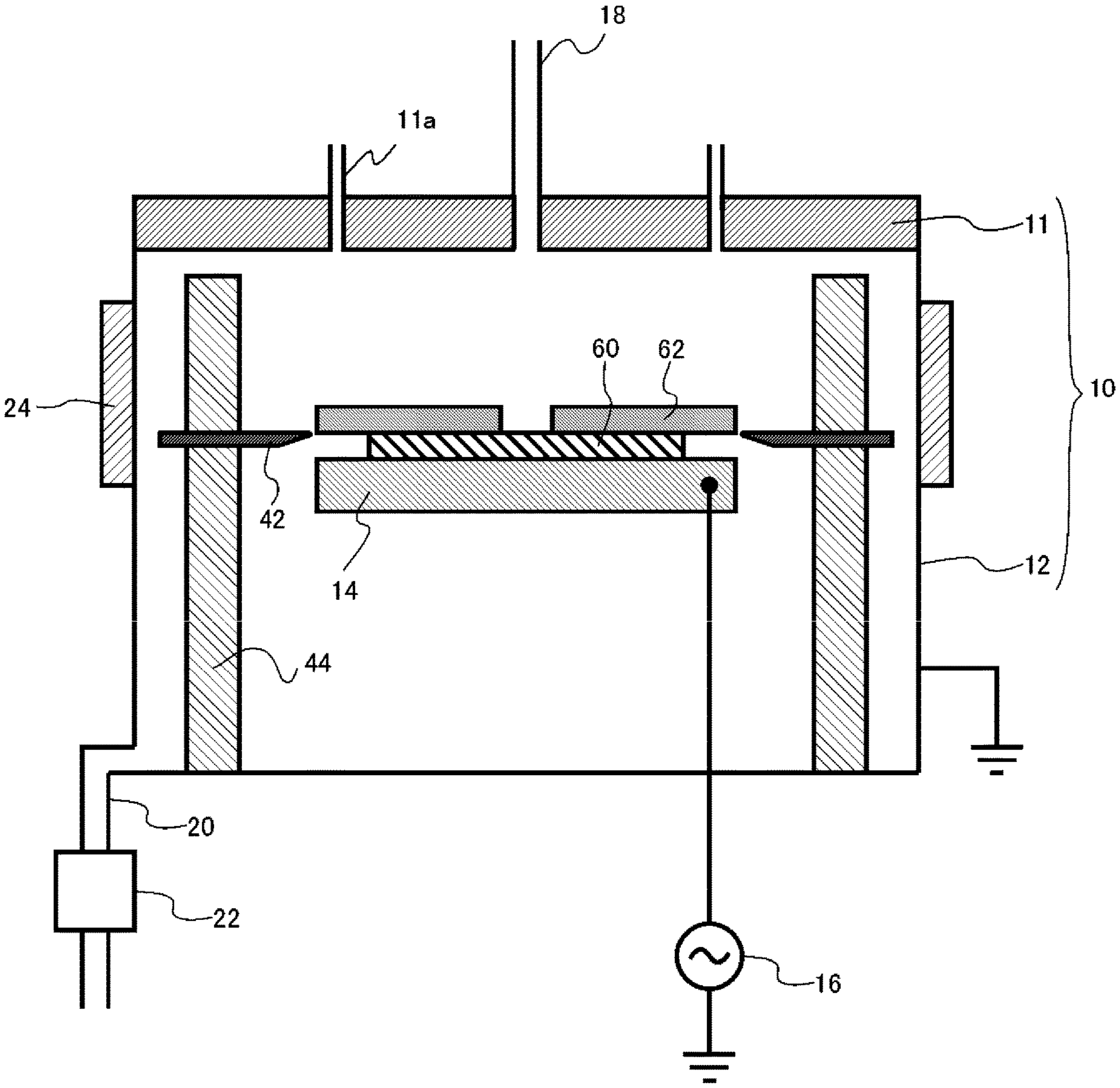
FIG. 16 is a diagram illustrating an example of a semiconductor device manufacturing method according to the second embodiment.

FIG. 13 is a bottom view illustrating a top plate of the semiconductor manufacturing apparatus according to the second embodiment. FIGS. 14 and 15 are diagrams illustrating an operation of a support member of the semiconductor manufacturing apparatus according to the second embodiment.

As illustrated in FIG. 13, for example, four adsorption holes 11*a* are provided in the top plate 11. The adsorption holes 11*a* are connected to, for example, a vacuum pump (not illustrated). The adsorption holes 11*a* function to vacuum-adsorb the substrate to the top plate.

As illustrated in FIG. 14, tip ends of the support pins 42 can move in the direction orienting from the side wall 12 to the holder 14. In other words, the tip ends of the support pins 42 can move in the horizontal direction. The support pins 42 move in the horizontal direction by a driving mechanism (not illustrated) built in the guide rails 44. The support pins 42 are moved in the horizontal direction to support the lower surface of a substrate (not illustrated).

As illustrated in FIG. 15, the support pins 42 can move in the direction orienting from the holder 14 to the top plate 11. The support pins 42 can move the substrate (not illustrated) in the direction orienting from the holder 14 to the top plate 11. The support pins 42 can move in the vertical direction. The support pins 42 are moved, for example, in the vertical direction along the guide rails 44 by a driving mechanism (not illustrated) built in the guide rails 44.

For example, the semiconductor wafer W placed on the holder 14 is subjected to anisotropic etching using plasma generated between the top plate 11 and the holder 14 in the chamber 10.

Next, a semiconductor device manufacturing method performed using the semiconductor manufacturing apparatus according to the second embodiment will be described. The semiconductor device manufacturing method according to the second embodiment includes etching by reactive ion etching on a layer containing a metallic element and a method of removing a byproduct generated in the etching.

The semiconductor device manufacturing method according to the second embodiment includes: importing a cover member in a chamber of a reactive ion etching apparatus that includes the chamber including a top plate and a side wall and a holder provided in the chamber; placing the cover member on the holder; covering at least a part of the top plate with the cover member by moving the cover member in a direction orienting from the holder to the top plate; importing a first substrate that includes a first layer containing indium (In) after covering at least the part of the top plate with the cover member; placing the first substrate on the holder; performing an etching process of etching the first layer; exporting the first substrate outside of the chamber; and exporting the cover member outside of the chamber after exporting the first substrate outside of the chamber.

FIGS. 16, 17, 18, 19, 20, 21, and 22 are diagrams illustrating examples of a semiconductor device manufacturing method according to the second embodiment.

First, a cover member 62 placed on a support substrate 60 is imported in of the chamber 10 of the RIE apparatus 100. The imported support substrate 60 and cover member 62 are placed on the holder 14 in the chamber 10 (see FIG. 16). The cover member 62 is an example of a substrate.

The support substrate 60 is, for example, a semiconductor wafer. The support substrate 60 is, for example, a silicon substrate.

The cover member 62 is, for example, an insulator. The cover member 62 is, for example, an aluminum oxide, an yttrium oxide, or quartz.

The cover member 62 includes, for example, an opening for passing a gas at a position corresponding to the gas supply pipe 18.

Surface roughness of the surface of the cover member 62 facing the holder 14 is greater than surface roughness of the surface of the top plate 11 facing the holder 14. In other words, surface roughness of the lower surface of the cover member 62 is, for example, greater than surface roughness of the lower surface of the top plate 11.

Arithmetic average roughness (Ra) of the surface of the cover member 62 facing the holder 14 is, for example, greater than arithmetic average roughness (Ra) of the surface of the top plate 11 facing the holder 14. In other words, arithmetic average roughness (Ra) of the lower surface of the cover member 62 is, for example, greater than arithmetic average roughness (Ra) of the lower surface of the top plate 11.

Figure 17:
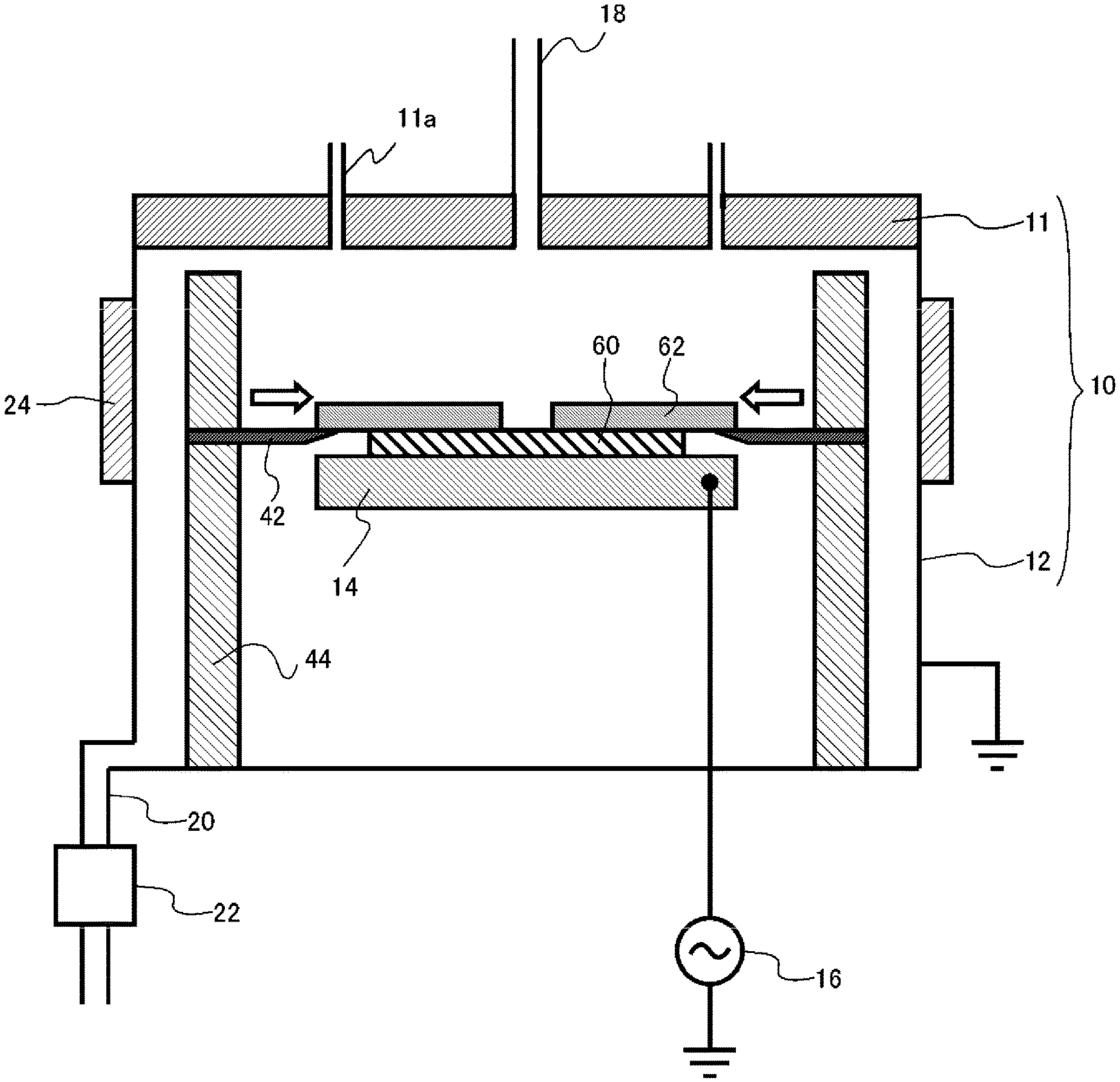
FIG. 17 is a diagram illustrating an example of the semiconductor device manufacturing method according to the second embodiment.
Figure 18:
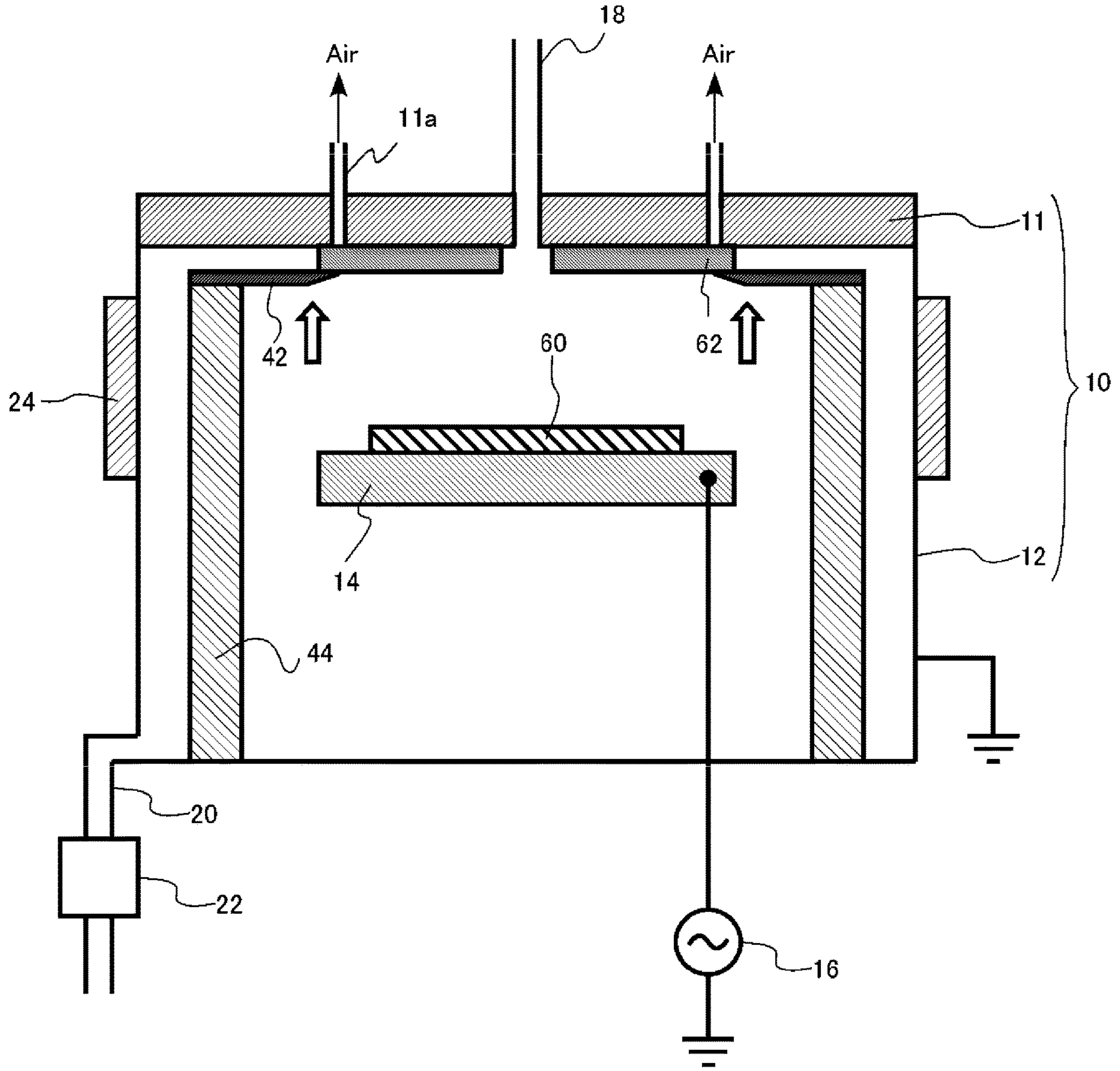
FIG. 18 is a diagram illustrating an example of the semiconductor device manufacturing method according to the second embodiment.

Subsequently, the support pins 42 are moved in the horizontal direction and the tip ends of the support pins 42 are inserted between the lower surface of the cover member 62 and the upper surface of the holder 14 (see FIG. 17). The tip ends of the support pins 42 can support the lower surface of the cover member 62.

Subsequently, the cover member 62 is moved in the direction orienting from the holder 14 to the top plate 11. The cover member 62 is moved upward by moving the support pins 42 upward along the guide rails 44. At least a part of the top plate 11 is covered with the cover member 62 (see FIG. 18).

For example, the upper surface of the cover member 62 is brought into contact with the lower surface of the top plate 11. Further, for example, the upper surface of the cover member 62 is vacuum-drawn from the adsorption holes 11*a* provided in the top plate 11 to be vacuum-adsorbed to the lower surface of the top plate 11.

Subsequently, the support substrate 60 is exported outside of the chamber 10.

Subsequently, the semiconductor wafer W including the first layer containing indium (In) is imported in the chamber 10. The semiconductor wafer W is an example of the first substrate. The semiconductor wafer W is, for example, a silicon substrate.

The first layer contains, for example, indium (In), tin (Sn), and oxygen (O). The first layer is, for example, an indium tin oxide layer. The first layer contains, for example, indium (In), gallium (Ga), zinc (Zn), and oxygen (O). The first layer is, for example, an indium gallium zinc oxide layer.

The imported semiconductor wafer W is placed on the holder 14 in the chamber 10.

Figure 19:
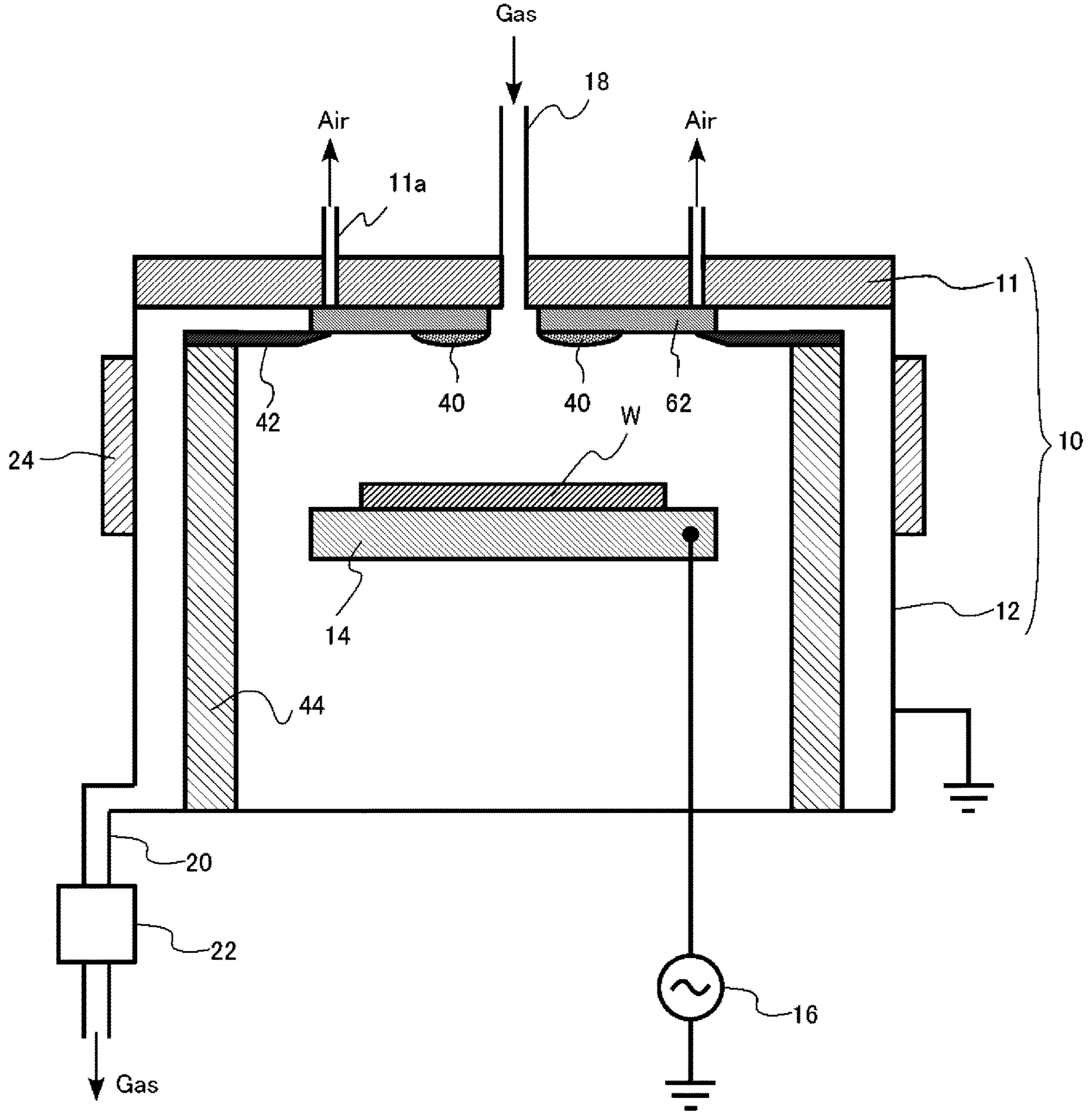
FIG. 19 is a diagram illustrating an example of the semiconductor device manufacturing method according to the second embodiment.
Figure 20:
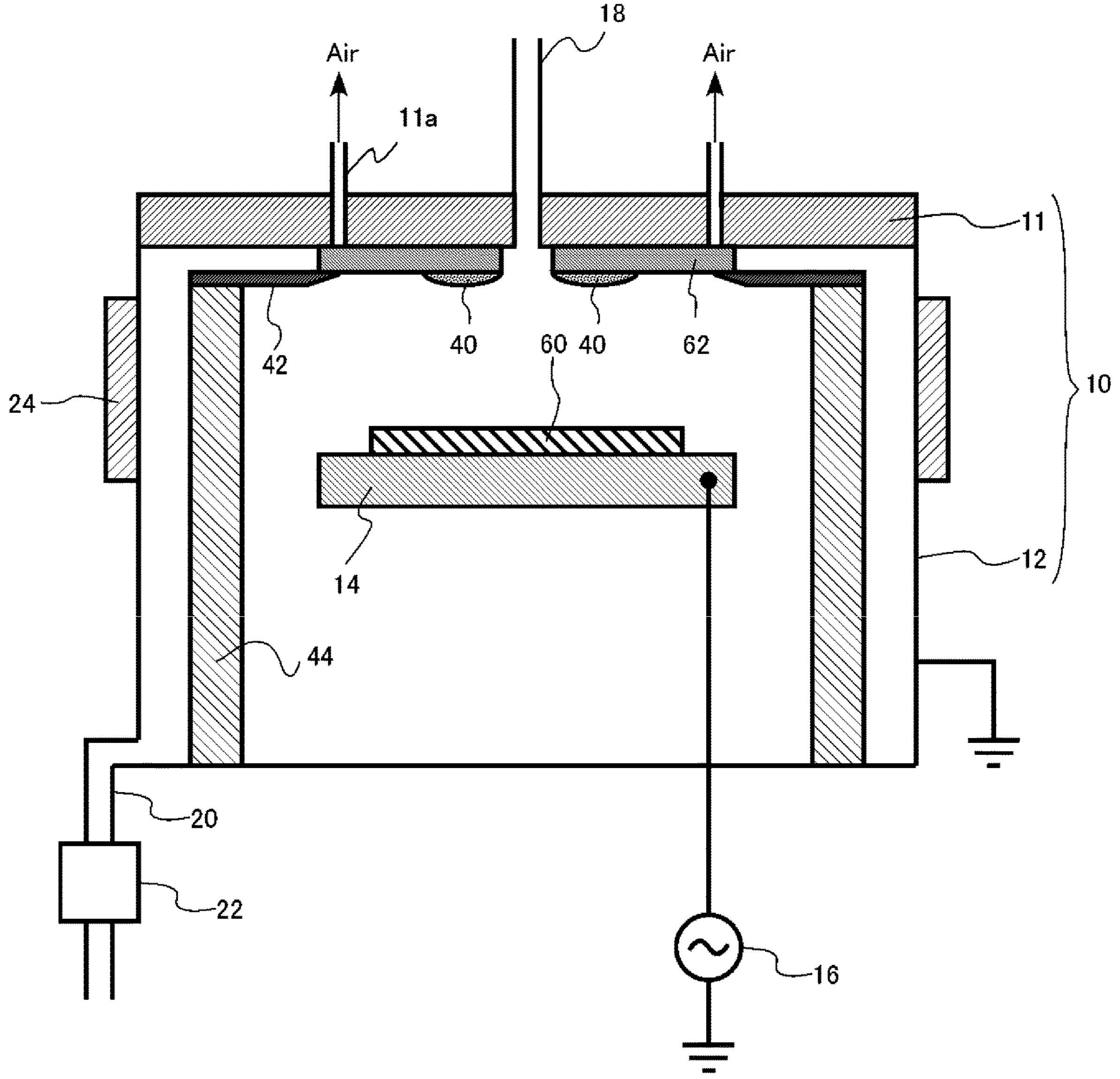
FIG. 20 is a diagram illustrating an example of the semiconductor device manufacturing method according to the second embodiment.
Figure 21:
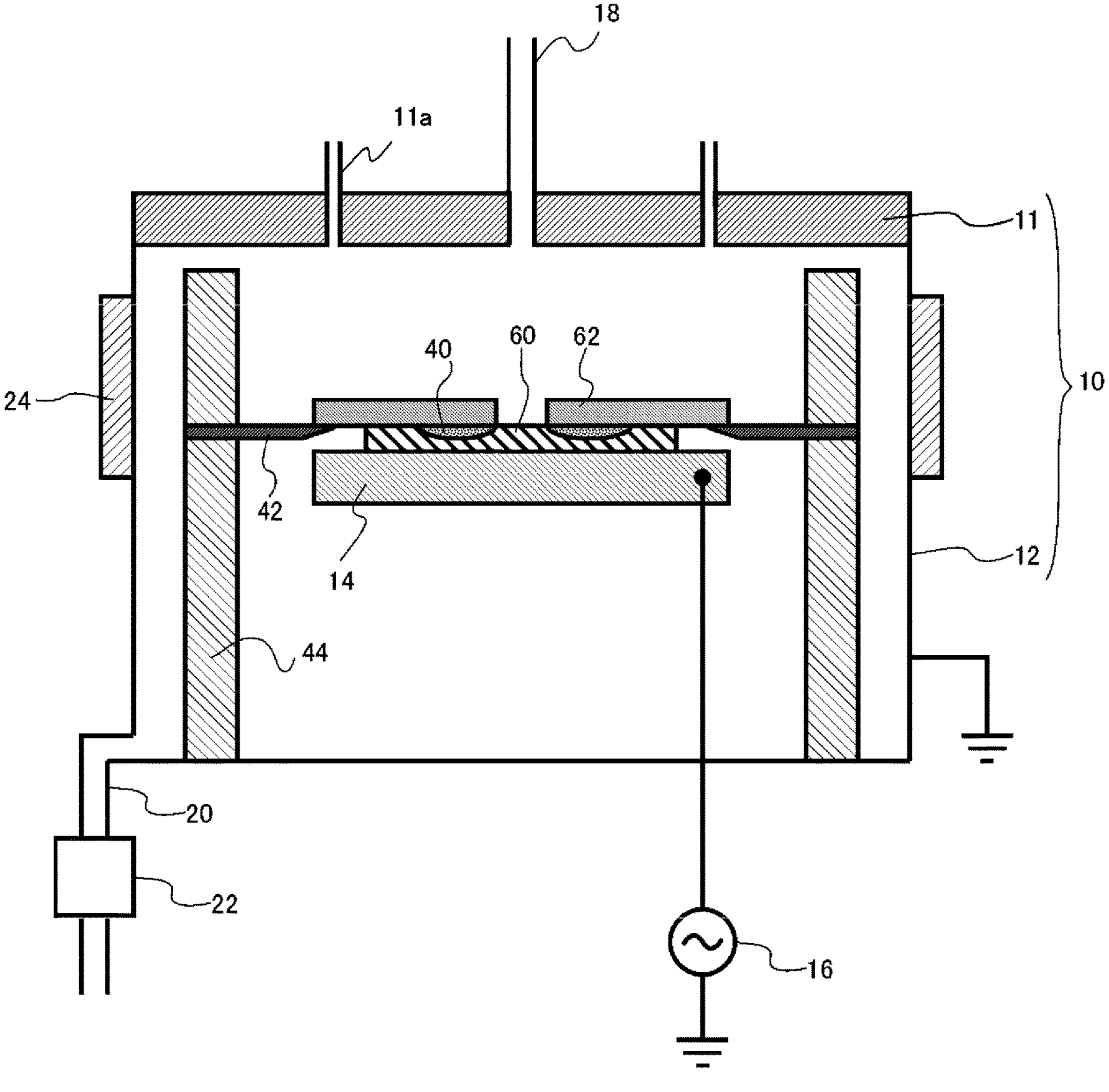
FIG. 21 is a diagram illustrating an example of the semiconductor device manufacturing method according to the second embodiment.

Subsequently, an etching process of etching the first layer is performed (see FIG. 19). For example, a methane gas ($CH_4$) and a hydrogen gas ($H_2$) are supplied as an etching gas from the gas supply pipe 18 in the chamber 10. The exhaust device 22 is operated to depressurize a pressure in the chamber 10 and maintain a predetermined pressure. For example, a gas containing fluorine (F) may also be used as the etching gas.

Subsequently, the high-frequency power source 16 applies high-frequency power to the holder 14. The high-frequency power source 16 generates plasma in the chamber 10 by the high-frequency power applied to the holder 14. Ions or radicals in the plasma collide with the semiconductor wafer W to etch the first layer.

Subsequently, the application of the high-frequency power to the holder 14 is stopped and the supply of the etching gas is stopped. The etching process ends. After the etching process ends, the semiconductor wafer W is exported outside of the chamber 10.

In the etching process, a byproduct 40 containing indium (In) is attached to the lower surface of the cover member 62. Since the lower surface of the top plate 11 is covered with the cover member 62, the byproduct 40 containing indium (In) is not attached. The byproduct 40 containing indium is, for example, an oxide. When the etching gas contains fluorine (F), the byproduct 40 containing indium is, for example, a fluoride.

For example, the importing of the semiconductor wafer W including the first layer containing indium (In) in the chamber 10, the etching of the first layer, and the exporting of the semiconductor wafer W outside of the chamber 10 are repeated a plurality of times.

Subsequently, the support substrate 60 is imported in the chamber 10. The support substrate 60 imported in the chamber 10 is placed on the holder 14 (see FIG. 20).

Subsequently, the vacuum-drawing from the adsorption holes 11*a* provided in the top plate 11 is stopped. The cover member 62 can be isolated from the top plate.

Subsequently, the cover member 62 is moved in the direction orienting from the top plate 11 to the holder 14. When the support pins 42 are moved downward, the cover member 62 is moved downward along the guide rails 44. The cover member 62 is placed on the support substrate 60 (see FIG. 21).

Figure 22:
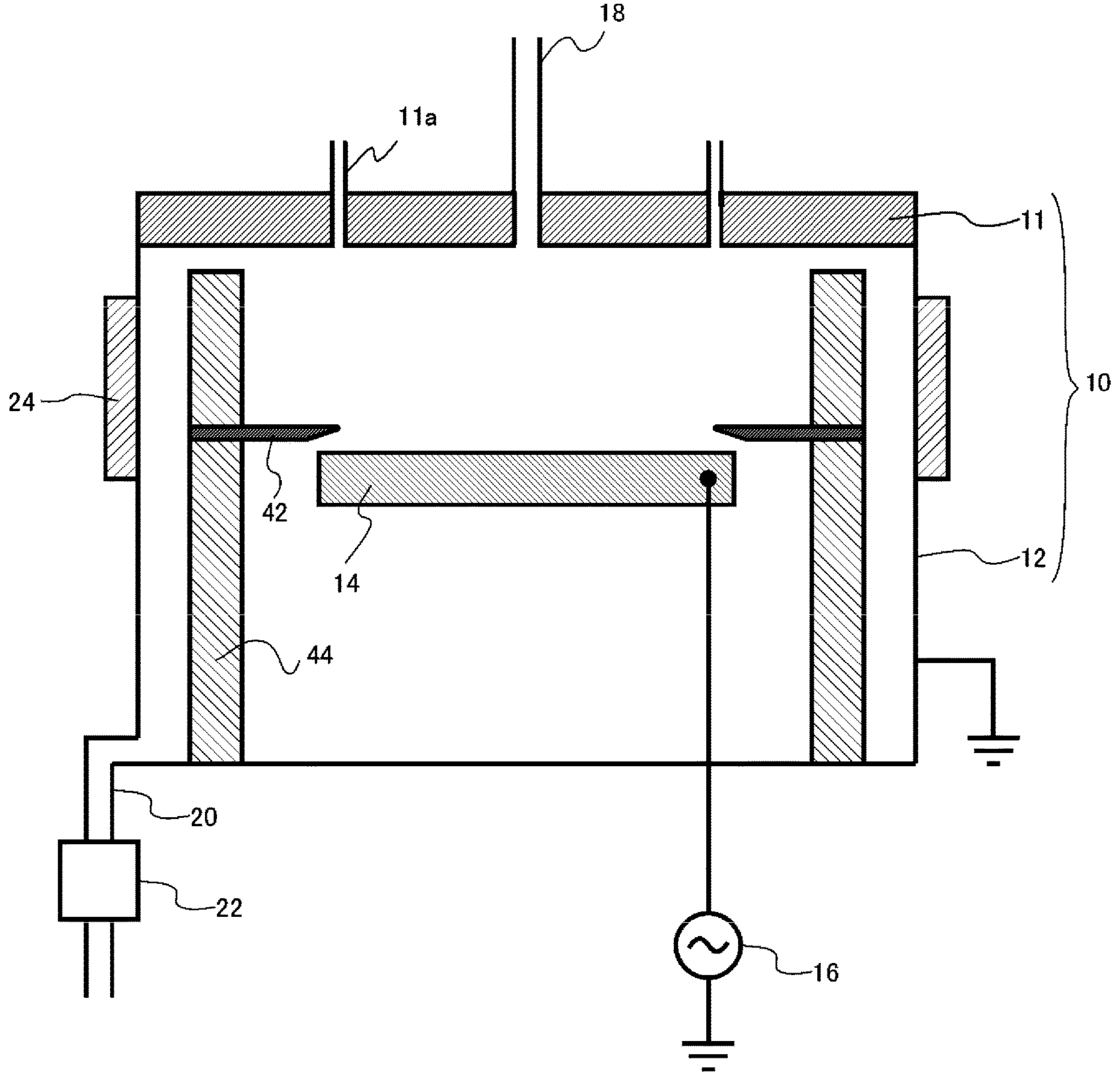
FIG. 22 is a diagram illustrating an example of the semiconductor device manufacturing method according to the second embodiment.

Subsequently, the cover member 62 to which the byproduct 40 containing indium is attached is exported outside of the chamber 10 along with the support substrate 60 (see FIG. 22).

Next, operational effects and advantages of the semiconductor manufacturing apparatus and the semiconductor device manufacturing method according to the second embodiment will be described.

For example, when a layer containing indium (In) such as an indium tin oxide layer provided in a semiconductor device is etched using the RIE apparatus, a byproduct containing indium (In) is attached to the inner surface of the chamber. The byproduct containing indium is attached to, for example, the lower surface of the top plate of the chamber.

The byproduct attached to the lower surface of the top plate of the chamber is a cause for generating, for example, particles. The particles generated in the chamber deteriorate, for example, a manufacturing yield of semiconductor devices. Accordingly, it is necessary to remove the byproduct attached to the lower surface of the top plate of the chamber periodically. That is, it is necessary to perform a cleaning process on the chamber periodically.

A vapor pressure of the byproduct containing indium is low. In other words, the byproduct containing indium rarely volatilizes. Therefore, for example, to remove the byproduct containing indium by heating, a high temperature equal to or greater than a temperature exceeding resistance of the RIE apparatus is necessary.

Accordingly, for example, a method of opening the chamber and removing the byproduct containing indium by wet etching or the like may also be conceived. However, in this case, a time necessary for the cleaning process becomes longer and a turn-around time for semiconductor device manufacturing increases. Accordingly, for example, manufacturing cost of a semiconductor device is raised.

In the semiconductor manufacturing apparatus and the semiconductor device manufacturing method according to the second embodiment, the byproduct 40 containing indium is prevented from being attached to the lower surface of the top plate 11 of the chamber 10 by covering the top plate 11 with the cover member 62. The cover member 62 can be imported inside of the chamber 10 and exported outside of the chamber 10 without opening the chamber 10. Therefore, the byproduct 40 containing indium can be removed without opening the chamber. Accordingly, for example, the time necessary for the cleaning process becomes shorter and the turn-around time for semiconductor device manufacturing decreases.

In the semiconductor manufacturing apparatus according to the second embodiment, the top plate 11 preferably has the adsorption holes 11*a*. The cover member 62 can be stably fixed to the top plate 11. The top plate 11 may also be configured with no adsorption holes 11*a*.

In the semiconductor device manufacturing method according to the second embodiment, surface roughness of the surface of the cover member 62 facing the holder 14 is preferably greater than surface roughness of the surface of the top plate 11 facing the holder 14. Since the surface roughness of the surface of the cover member 62 facing the holder 14 is greater, the byproduct 40 is easily attached to the cover member 62 and is rarely taken. Accordingly, for example, collection efficiency of the byproduct 40 by the cover member 62 is improved. For example, the byproduct 40 is inhibited from being released from the cover member 62 in the apparatus during moving the cover member 62.

In the semiconductor device manufacturing method according to the second embodiment, the cover member 62 is preferably placed and moved on the support substrate 60. For example, when the lower surface of the cover member 62 to which the byproduct 40 is attached comes into direct contact with the surface of the holder 14, there is concern of the byproduct 40 being attached to the surface of the holder 14 and causing pollution. Further, the support substrate 60 may not be used. An area of the cover member 62 may be greater than an area of the semiconductor wafer W. By covering a large range of the top plate 11 with the cover member 62, it is possible to prevent the byproduct 40 from being attached to the inner surface of the chamber 10 more efficiently.

First Modified Example

A semiconductor manufacturing apparatus according to a first modified example of the second embodiment is different from the semiconductor manufacturing apparatus according to the second embodiment in that a holder includes an edge ring which is provided in the outer circumference of the holder and can move up and down, and a tip end of a support member can be inserted between the substrate and the edge ring.

Figure 23:
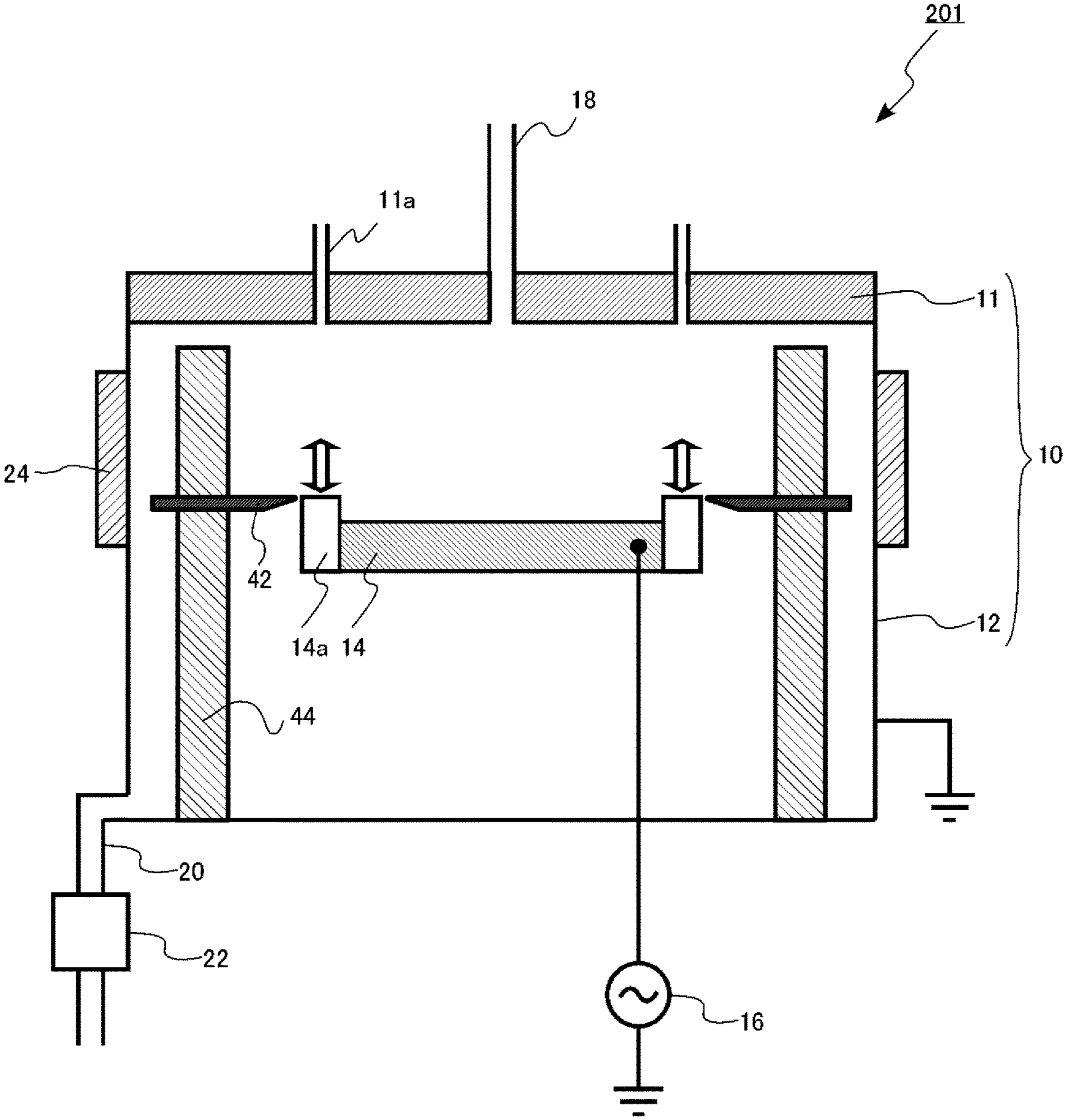
FIG. 23 is a schematic diagram illustrating a semiconductor manufacturing apparatus according to a first modified example of the second embodiment.

FIG. 23 is a schematic diagram illustrating a semiconductor manufacturing apparatus according to the first modified example of the second embodiment.

An RIE apparatus 201 according to the first modified example of the second embodiment includes, for example, a chamber 10, a holder 14, a high-frequency power source 16, a gas supply pipe 18, a gas discharge pipe 20, an exhaust device 22, a heater 24, a plurality of support pins 42, and a plurality of guide rails 44. The support pin 42 is an example of a support member. The guide rail 44 is an example of a guide unit.

The chamber 10 includes a top plate 11 and a side wall 12. The top plate 11 has an adsorption hole 11*a*. The holder 14 includes an edge ring 14*a*.

The edge ring 14*a* is provided in the outer circumference of the holder 14. The edge ring 14*a* improve an etching property in the outer region of the holder 14. The edge ring 14*a* can move up and down in the vertical direction.

Figure 24:
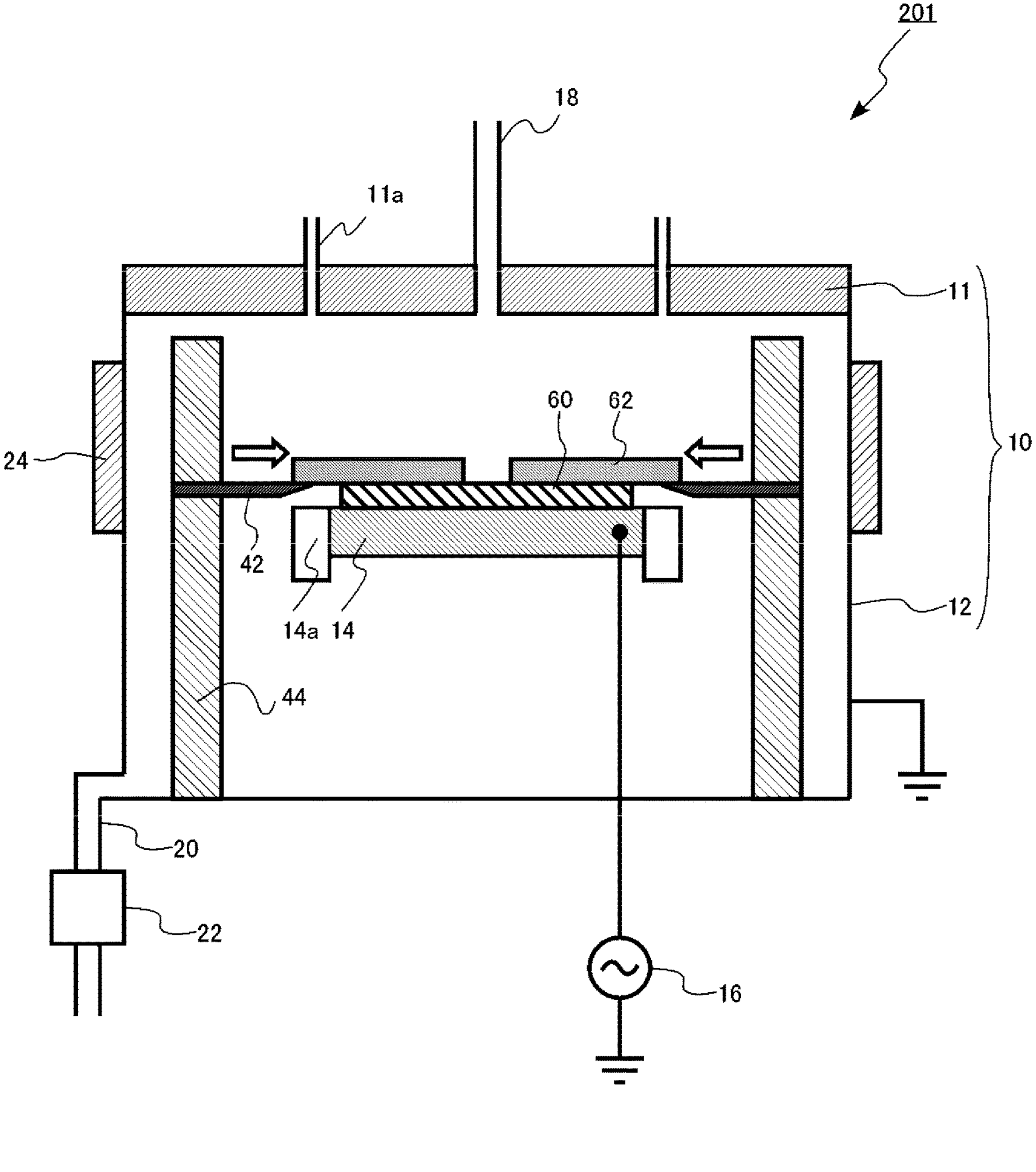
FIG. 24 is a diagram illustrating an operation of a support member of the semiconductor manufacturing apparatus according to the first modified example of the second embodiment.

FIG. 24 is a diagram illustrating an operation of the support member of the semiconductor manufacturing apparatus according to the first modified example of the second embodiment.

The RIE apparatus 201 according to the first modified example of the second embodiment lowers the edge ring 14*a* and then moves the support pins 42 in the horizontal direction. The tip ends of the support pins 42 are inserted between the lower surface of the cover member 62 and the upper surface of the edge ring 14*a*. The tip ends of the support pins 42 can support the lower surface of the cover member 62.

The RIE apparatus 201 according to the first modified example of the second embodiment may be used to remove the byproduct 40 containing indium without opening the chamber in accordance with a method similar to the semiconductor device manufacturing method of the second embodiment.

Second Modified Example

The semiconductor manufacturing apparatus according to a second modified example of the second embodiment is different from the semiconductor manufacturing apparatus according to the second embodiment in that a plurality of support members are each supported, are provided in the top plate, and include a support rod extending in the vertical direction.

Figure 25:
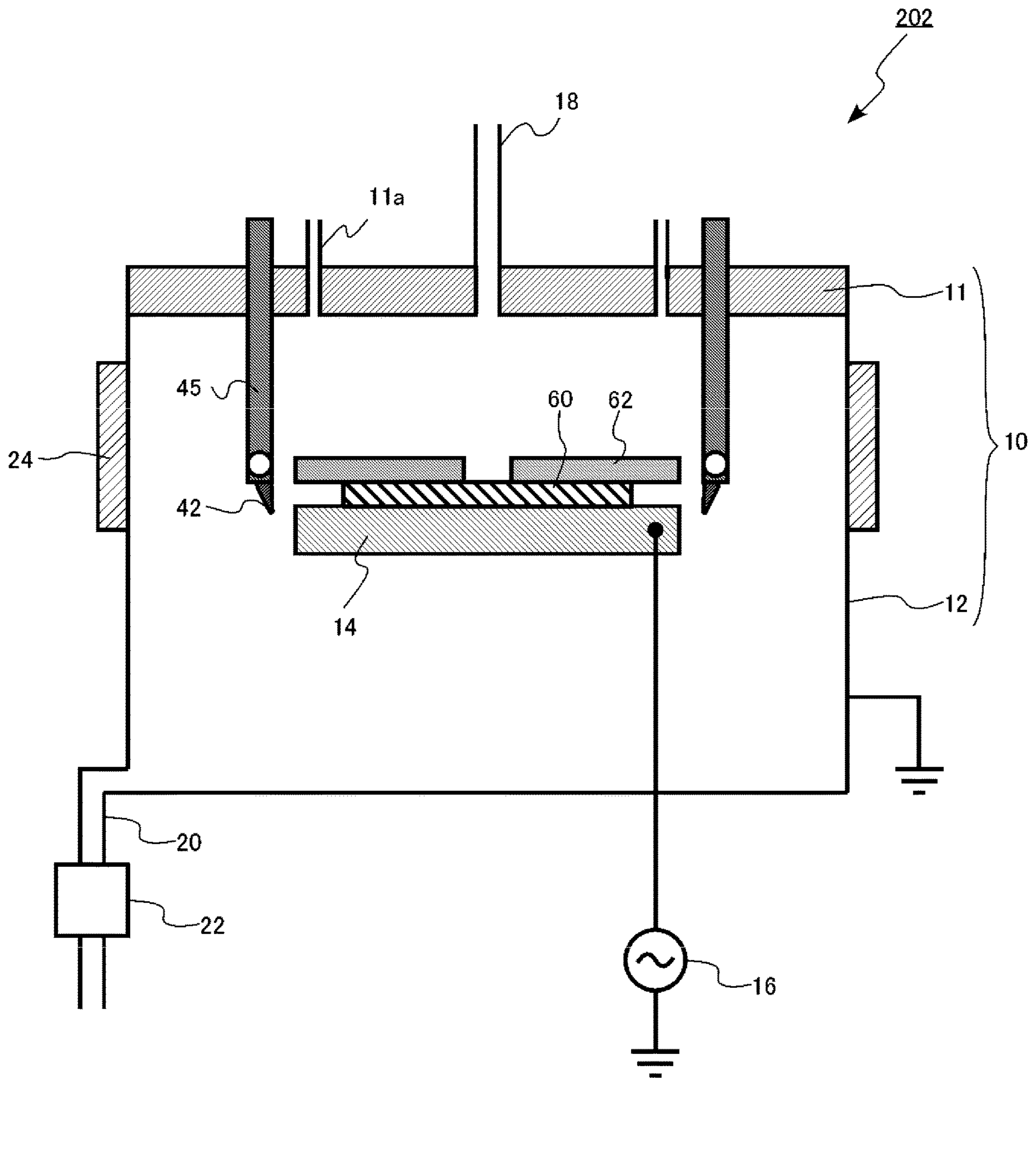
FIG. 25 is a schematic diagram illustrating a semiconductor manufacturing apparatus according to a second modified example of the second embodiment.

FIG. 25 is a schematic diagram illustrating a semiconductor manufacturing apparatus according to the second modified example of the second embodiment.

An RIE apparatus 202 according to the second modified example of the second embodiment includes, for example, a chamber 10, a holder 14, a high-frequency power source 16, a gas supply pipe 18, a gas discharge pipe 20, an exhaust device 22, a heater 24, a plurality of support pins 42, and a plurality of support arms 45. The support pin 42 is an example of a support member. The support arm 45 is an example of a support rod.

The chamber 10 includes a top plate 11 and a side wall 12. The top plate 11 has an adsorption hole 11*a*. The holder 14 includes an edge ring 14*a*.

The support arms 45 extend in a direction orienting from the holder 14 to the top plate 11. The support arms 45 extend in the vertical direction. The support arms 45 are provided in the top plate. The support arms 45 can be moved in the vertical direction using a driving mechanism (not illustrated). The support arms 45 support the support pins 42. The support pins 42 are provided in lower ends of the support arms 45 so that the support pins 42 can be rotated.

Figure 26:
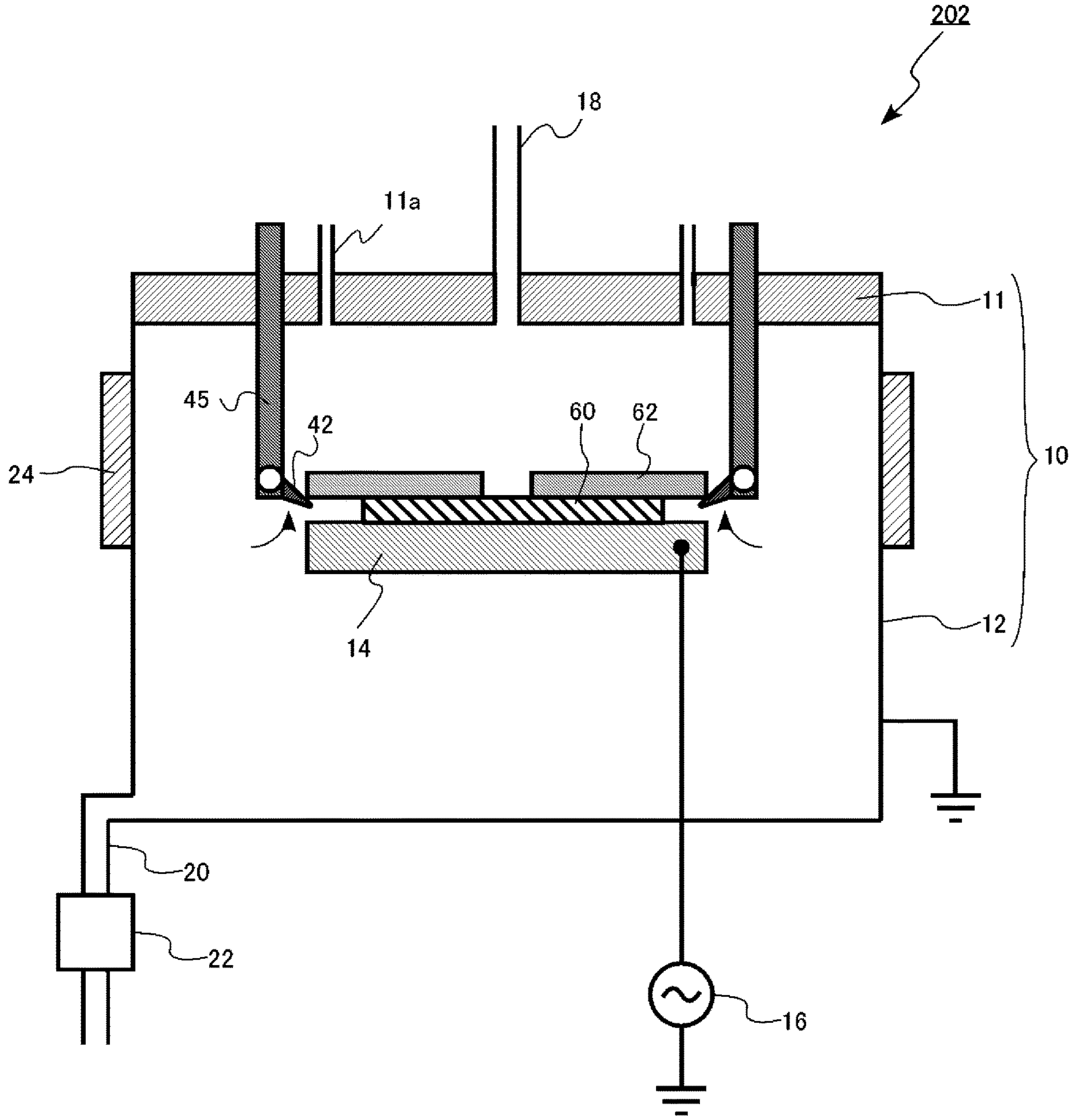
FIG. 26 is a diagram illustrating an operation of a support member of the semiconductor manufacturing apparatus according to a second modified example of the second embodiment.
Figure 27:
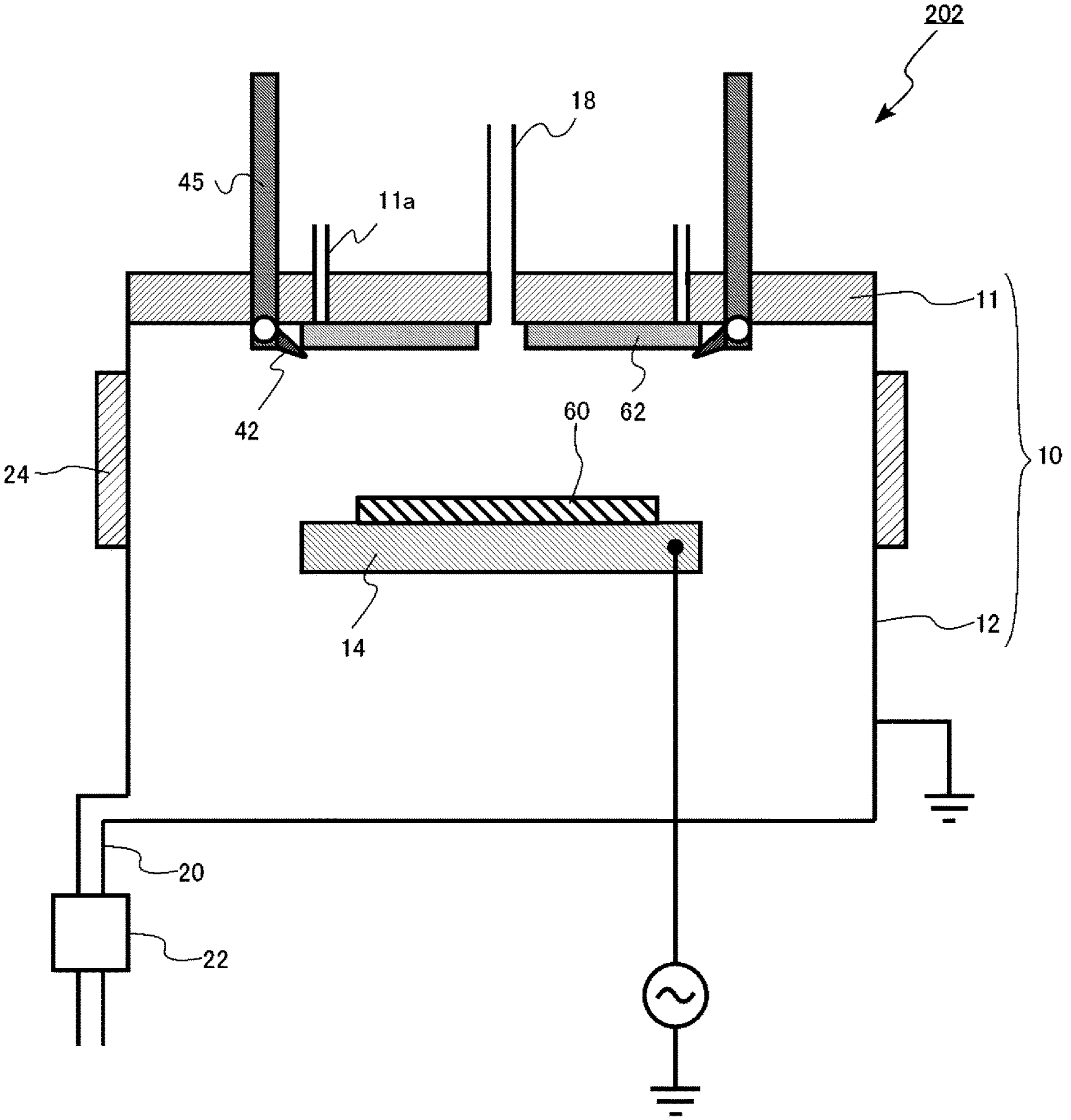
FIG. 27 is a diagram illustrating an operation of the support member of the semiconductor manufacturing apparatus according to the second modified example of the second embodiment.

FIGS. 26 and 27 are diagrams illustrating an operation of the support member of the semiconductor manufacturing apparatus according to the second modified example of the second embodiment.

In the RIE apparatus 202 according to the second modified example of the second embodiment, for example, as illustrated in FIG. 26, the support pins 42 are moved in the horizontal direction by placing the support substrate 60 and the cover member 62 on the holder 14 and then rotating the support pins 42. The tip ends of the support pins 42 are inserted between the lower surface of the cover member 62 and the upper surface of the holder 14. The tip ends of the support pins 42 can support the lower surface of the cover member 62.

Thereafter, as illustrated in FIG. 27, by moving the support pins 42 upwards along with the support arms 45, it is possible to cover the top plate 11 with the cover member 62.

The RIE apparatus 202 according to the second modified example of the second embodiment may be used to remove the byproduct 40 containing indium without opening the chamber in accordance with a method similar to the semiconductor device manufacturing method of the second embodiment.

As described above, according to the semiconductor manufacturing apparatus and the semiconductor device manufacturing method according to the second embodiment and the modified example, it is possible to remove the byproduct containing indium without opening the chamber.

Third Embodiment

A semiconductor manufacturing apparatus according to a third embodiment includes: a chamber including a top plate and a side wall; a holder provided in the chamber and configured such that a substrate is placed on the holder; a high-frequency power source configured to apply high-frequency power to the holder; a gas supply pipe configured to supply a gas to the chamber; a gas discharge pipe configured to discharge a gas from the chamber; and a plurality of lift pins configured to push up the substrate in a direction orienting from the holder to the top plate and configured such that tip ends of the lift pins are able to move from an upper surface of the holder to a position of 70% or more of a distance between the holder and the top plate. In the semiconductor manufacturing apparatus according to the third embodiment, the top plate has adsorption holes for vacuum-adsorbing the upper surface of the substrate to the top plate.

Figure 28:
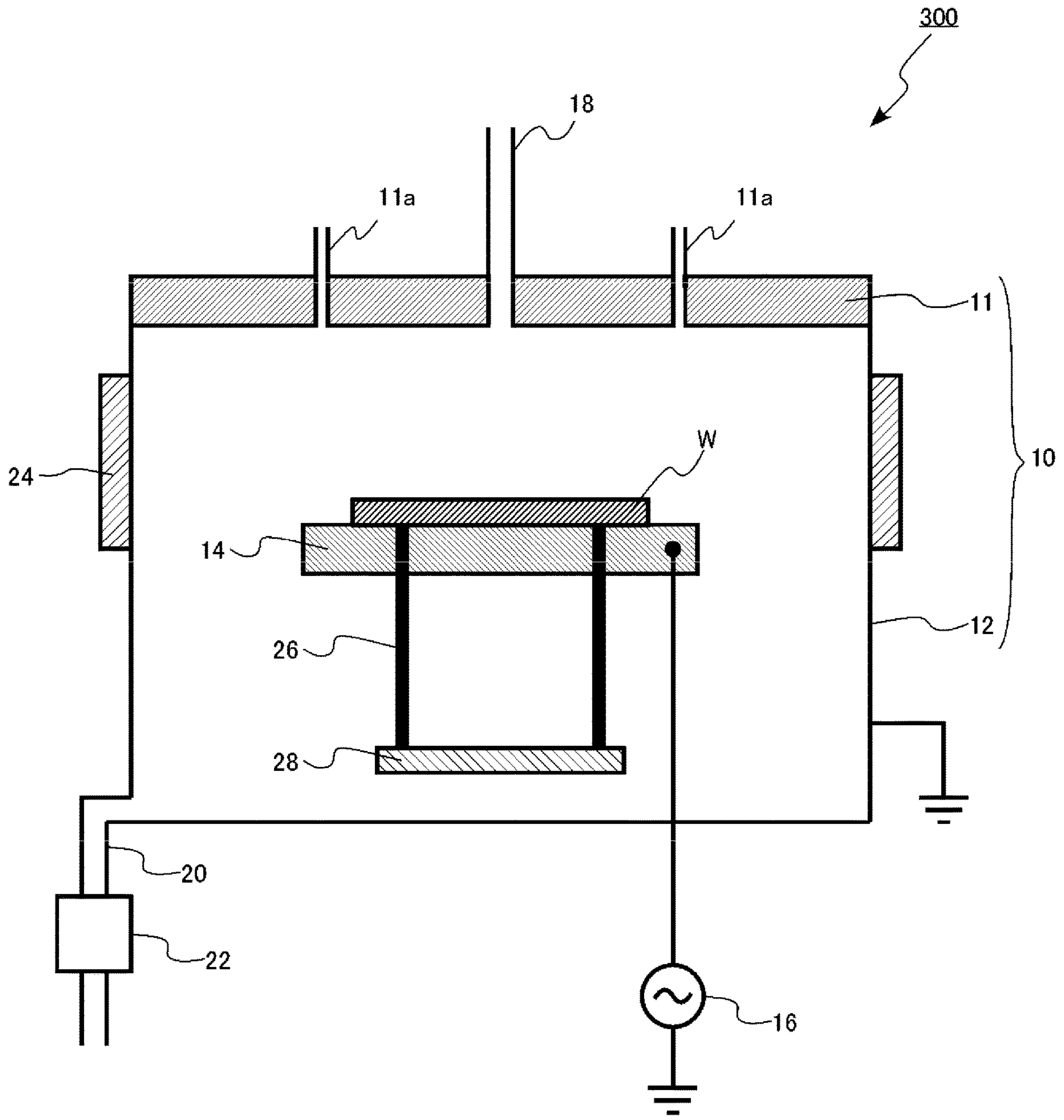
FIG. 28 is a schematic diagram illustrating a semiconductor manufacturing apparatus according to a third embodiment.
Figure 29:
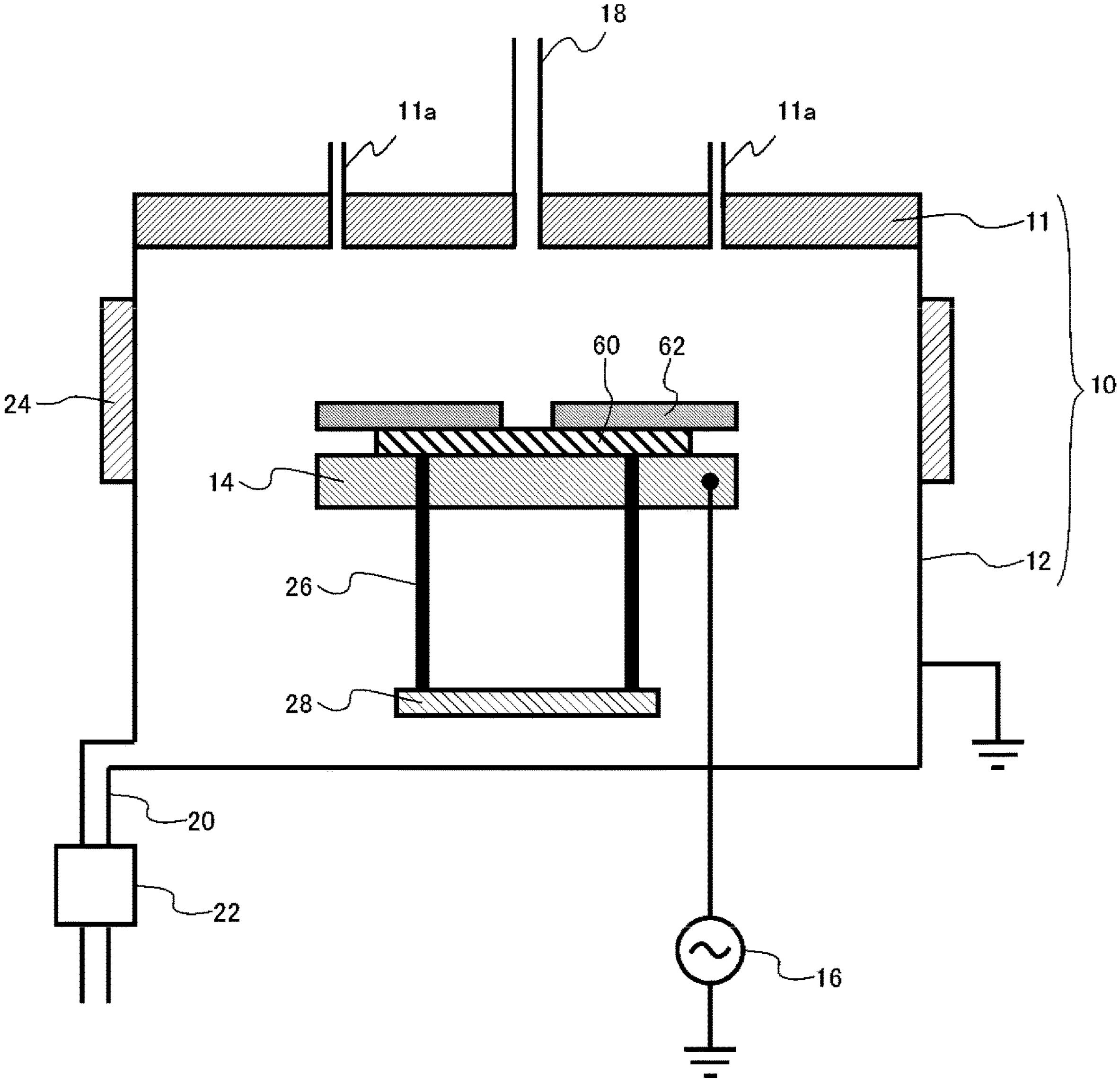
FIG. 29 is a diagram illustrating an example of a semiconductor device manufacturing method according to the third embodiment.
Figure 30:
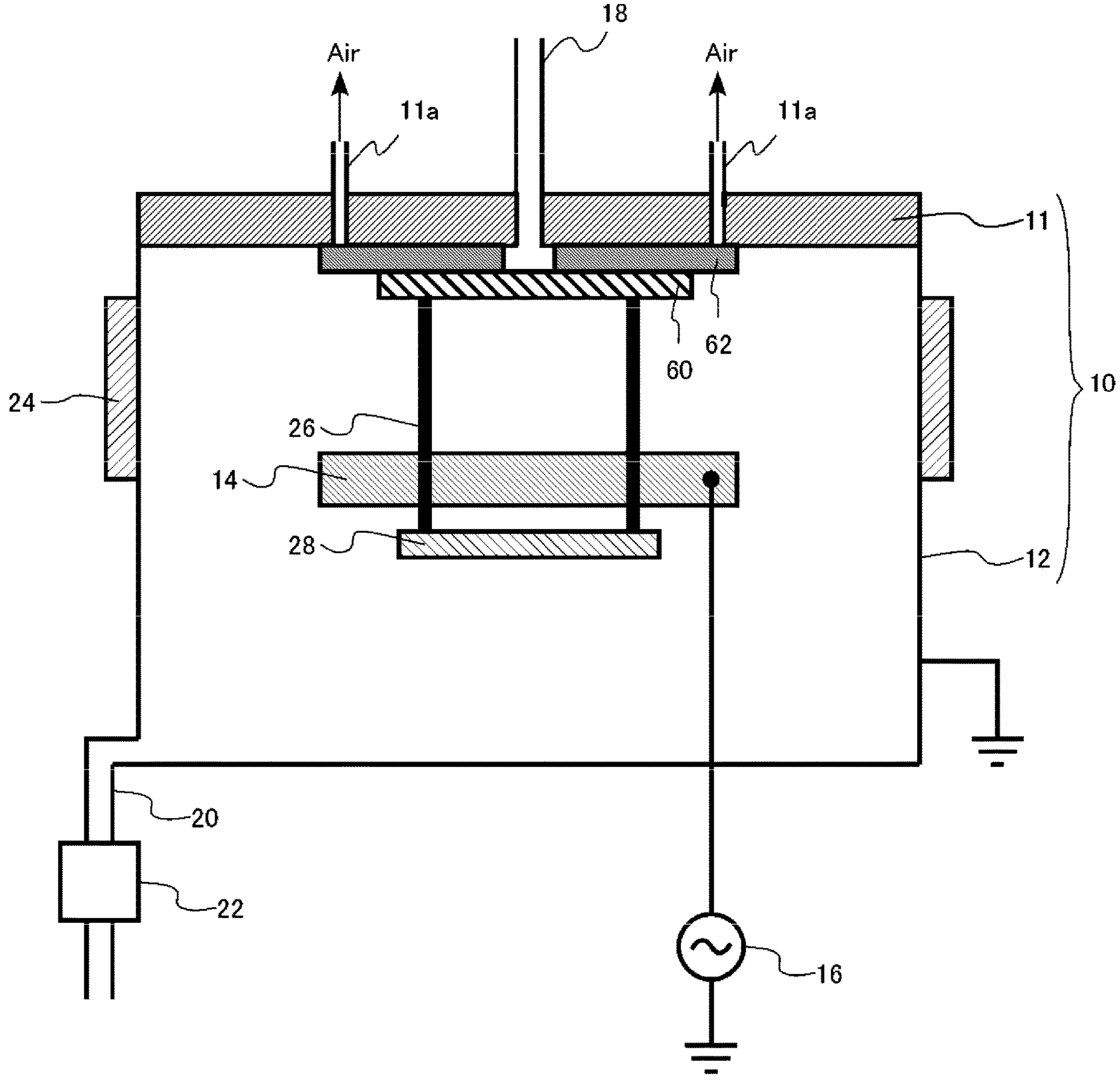
FIG. 30 is a diagram illustrating an example of the semiconductor device manufacturing method according to the third embodiment.
Figure 31:
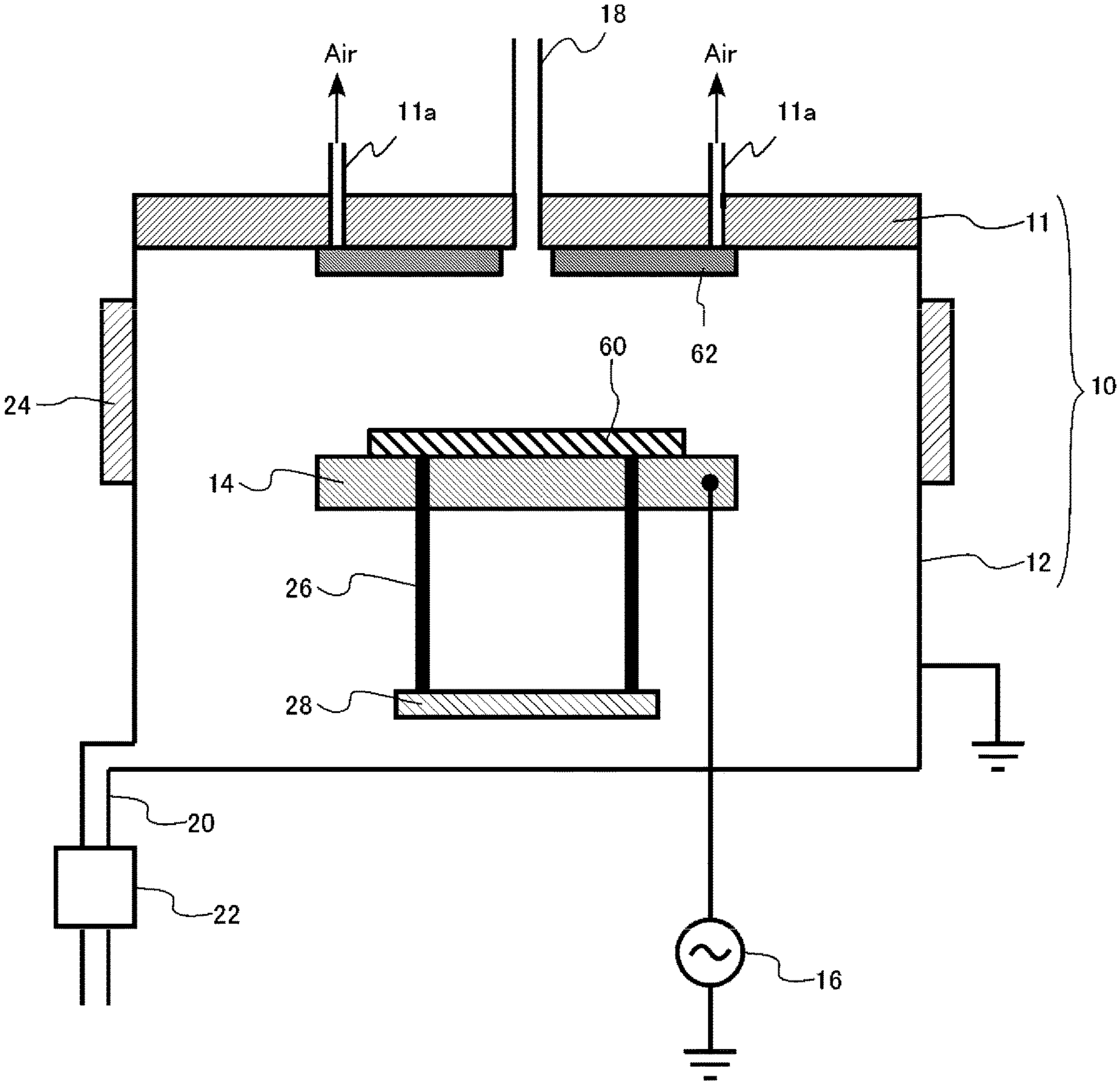
FIG. 31 is a diagram illustrating an example of the semiconductor device manufacturing method according to the third embodiment.

FIG. 28 is a schematic diagram illustrating a semiconductor manufacturing apparatus according to the third embodiment. The semiconductor manufacturing apparatus according to the third embodiment is a reactive ion etching apparatus (RIE apparatus). The reactive ion etching apparatus according to the third embodiment is a capacitively coupled plasma apparatus (CCP apparatus).

An RIE apparatus 300 according to the third embodiment includes, for example, a chamber 10, a holder 14, a high-frequency power source 16, a gas supply pipe 18, a gas discharge pipe 20, an exhaust device 22, a heater 24, a plurality of lift pins 26, and a lift pin support plate 28.

The chamber 10 includes a top plate 11 and a side wall 12. The top plate 11 has adsorption holes 11*a*.

The top plate 11 is provided in an upper portion of the chamber 10. The top plate 11 functions as, for example, an upper electrode. The top plate 11 is formed of, for example, a metal.

The adsorption holes 11*a* are provided in the top plate 11. The adsorption holes 11*a* are connected to, for example, a vacuum pump (not illustrated). The adsorption holes 11*a* have a function of vacuum-adsorbing the substrate to the top plate.

The side wall 12 surrounds around the holder 14. The side wall 12 is formed of, for example, a metal. For example, the side wall 12 is grounded.

The holder 14 is provided in the chamber 10. For example, a semiconductor wafer W is placed on the holder 14. The semiconductor wafer W is an example of a substrate.

The holder 14 includes, for example, an electrostatic chuck (not illustrated) on an upper surface. The holder 14 adsorbs the semiconductor wafer W using, for example, the electrostatic chuck.

The holder 14 functions as a lower electrode. High-frequency power is applied to the holder 14. The holder 14 is formed of, for example, a metal.

For example, a heater (not illustrated) is provided in the holder 14. The semiconductor wafer W placed on the holder 14 can be heated by the heater.

The high-frequency power source 16 functions to apply high-frequency power to the holder 14. The high-frequency power source 16 is connected to the holder 14. With the high-frequency power applied to the holder 14 by the high-frequency power source 16, plasma can be generated in the chamber 10.

The gas supply pipe 18 is provided, for example, in an upper portion of the chamber 10. A gas is supplied from the gas supply pipe 18 to the chamber 10.

For example, an etching gas or a cleaning gas can be supplied from the gas supply pipe 18. The etching gas is used, for example, to etch a processed layer formed in the semiconductor wafer W. The cleaning gas is used to remove byproducts generated in the etching of the processed layer.

The gas discharge pipe 20 is provided in a lower portion of the chamber 10. For example, an unconsumed etching gas, an unconsumed cleaning gas, or a reaction product is discharged outside of the chamber 10 from the gas discharge pipe 20.

The exhaust device 22 is connected to the gas discharge pipe 20. The exhaust device 22 is, for example, a vacuum pump.

The plurality of lift pins 26 have a function of pushing up a substrate placed on the holder 14 in the direction orienting from the holder 14 to the top plate 11. The lower ends of the plurality of lift pins 26 are fixed to, for example, the lift pin support plate 28. For example, the plurality of lift pins 26 penetrate through the holder 14.

The lift pins 26 can move in the direction orienting from the holder 14 to the top plate 11. For example, the lift pin support plate 28 is driven using a driving mechanism (not illustrated) so that the lift pins 26 can move up and down.

A distance from the upper surface of the holder 14 to the tip end of the lift pin 26 is 70% or more of a distance between the holder 14 and the top plate 11. In other words, the tip end of the lift pin 26 can move from the upper surface of the holder 14 to a position of 70% or more of the distance between the holder 14 and the top plate 11.

For example, the semiconductor wafer W placed on the holder 14 is subjected to anisotropic etching using plasma generated between the top plate 11 and the holder 14 in the chamber 10.

Next, a semiconductor device manufacturing method performed using the semiconductor manufacturing apparatus according to the third embodiment will be described. The semiconductor device manufacturing method according to the third embodiment includes etching by reactive ion etching on a layer containing a metallic element and a method of removing a byproduct generated in the etching.

The semiconductor device manufacturing method according to the third embodiment includes: importing a first substrate that includes a first layer containing indium (In) in a chamber of a reactive ion etching apparatus that includes the chamber including a top plate and a side wall and a holder provided in the chamber; placing the first substrate on the holder; performing an etching process of etching the first layer; exporting the first substrate outside of the chamber; importing a second substrate that includes a resin layer on a surface of the second substrate in the chamber after exporting the first substrate outside of the chamber; placing the second substrate on the holder; heating the second substrate; moving the second substrate in a direction orienting from the holder to the top plate and bringing the resin layer into contact with the top plate; cooling the second substrate; isolating the resin layer from the top plate; and exporting the second substrate outside of the chamber.

FIGS. 29, 30, 31, 32, 33, 34, 35, and 36 are diagrams illustrating examples of a semiconductor device manufacturing method according to the third embodiment.

First, a cover member 62 placed on a support substrate 60 is imported in the chamber 10 of the RIE apparatus 100. The imported support substrate 60 and cover member 62 are placed on the holder 14 in the chamber 10 (see FIG. 29). The cover member 62 is an example of a substrate.

The support substrate 60 is, for example, a semiconductor wafer. The support substrate 60 is, for example, a silicon substrate.

The cover member 62 is, for example, an insulator. The cover member 62 is, for example, an aluminum oxide, an yttrium oxide, or quartz.

The cover member 62 includes, for example, an opening for passing a gas at a position corresponding to the gas supply pipe 18.

Surface roughness of the surface of the cover member 62 facing the holder 14 is greater than surface roughness of the surface of the top plate 11 facing the holder 14. In other words, surface roughness of the lower surface of the cover member 62 is, for example, greater than surface roughness of the lower surface of the top plate 11.

Arithmetic average roughness (Ra) of the surface of the cover member 62 facing the holder 14 is, for example, greater than arithmetic average roughness (Ra) of the surface of the top plate 11 facing the holder 14. In other words, arithmetic average roughness (Ra) of the lower surface of the cover member 62 is, for example, greater than arithmetic average roughness (Ra) of the lower surface of the top plate 11.

Subsequently, the support substrate 60 and the cover member 62 are moved in a direction orienting from the holder 14 to the top plate 11 by using the lift pins 26. The support substrate 60 and the cover member 62 are lifted by the lift pins 26. At least a part of the top plate 11 is covered with the cover member 62 (see FIG. 30).

For example, the upper surface of the cover member 62 is brought into contact with the lower surface of the top plate 11. Further, for example, the upper surface of the cover member 62 is vacuum-drawn from the adsorption holes **11*a* provided in the top plate 11 to be vacuum-adsorbed to the lower surface of the top plate 11**.

Subsequently, the support substrate 60 is moved down using the lift pins 26. The support substrate 60 is placed on the holder 14 (see FIG. 31).

Subsequently, the support substrate 60 is exported outside of the chamber 10.

Subsequently, the semiconductor wafer W including the first layer containing indium (In) is imported in the chamber 10. The semiconductor wafer W is an example of the first substrate. The semiconductor wafer W is, for example, a silicon substrate.

The first layer contains, for example, indium (In), tin (Sn), and oxygen (O). The first layer is, for example, an indium tin oxide layer. The first layer contains, for example, indium (In), gallium (Ga), zinc (Zn), and oxygen (O). The first layer is, for example, an indium gallium zinc oxide layer.

The imported semiconductor wafer W is placed on the holder 14 in the chamber 10.

Figure 32:
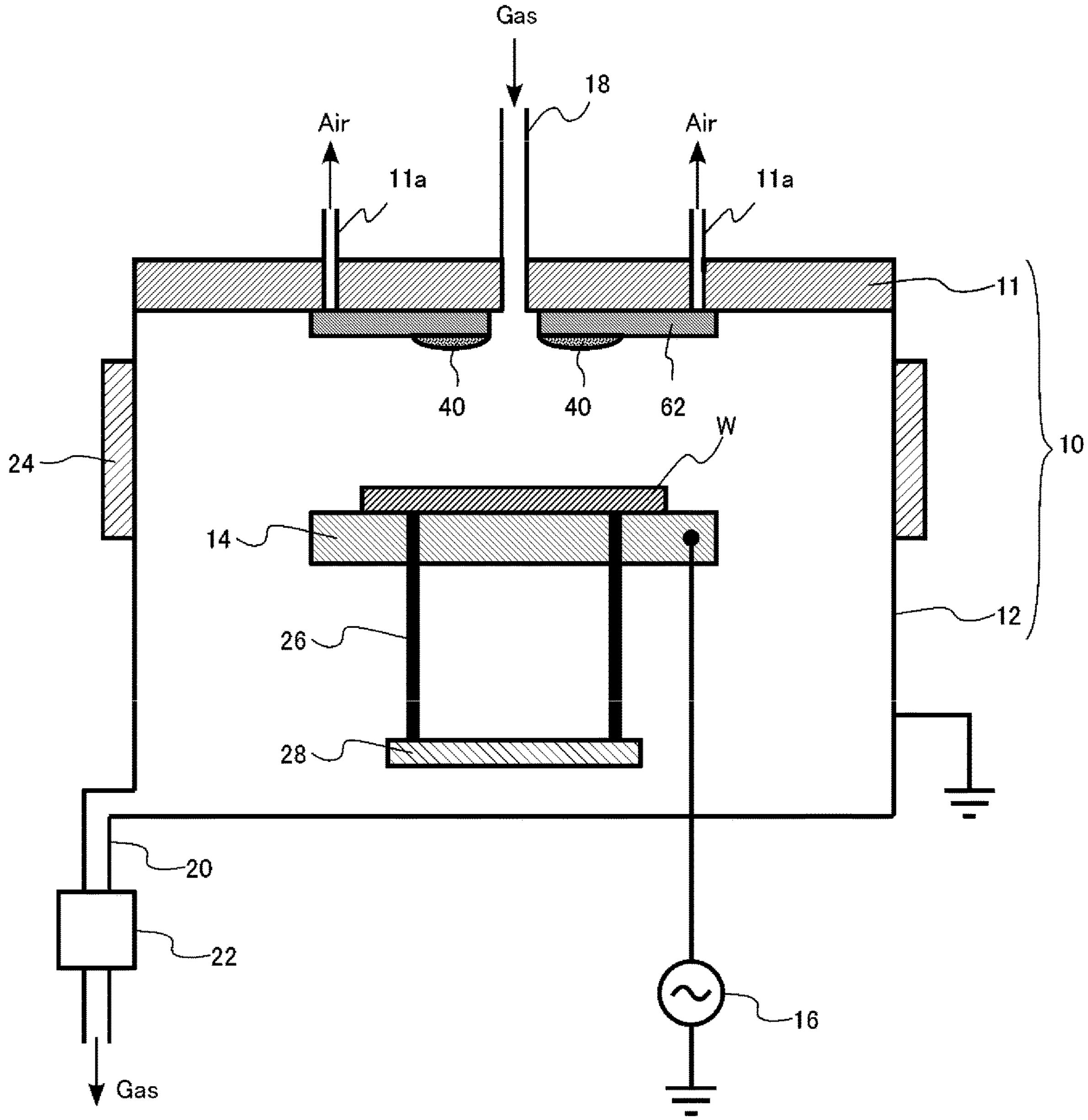
FIG. 32 is a diagram illustrating an example of the semiconductor device manufacturing method according to the third embodiment.
Figure 33:
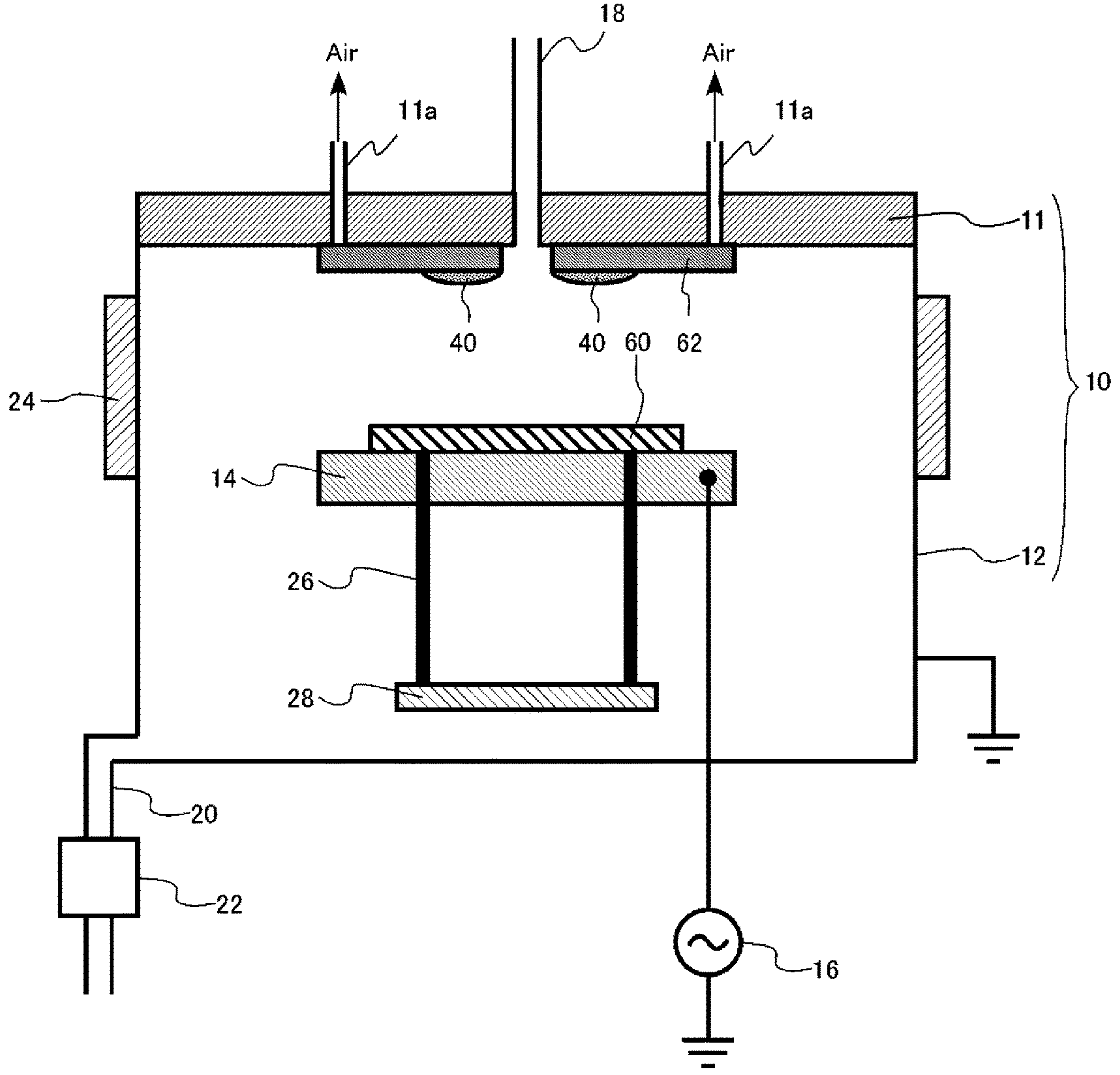
FIG. 33 is a diagram illustrating an example of the semiconductor device manufacturing method according to the third embodiment.
Figure 34:
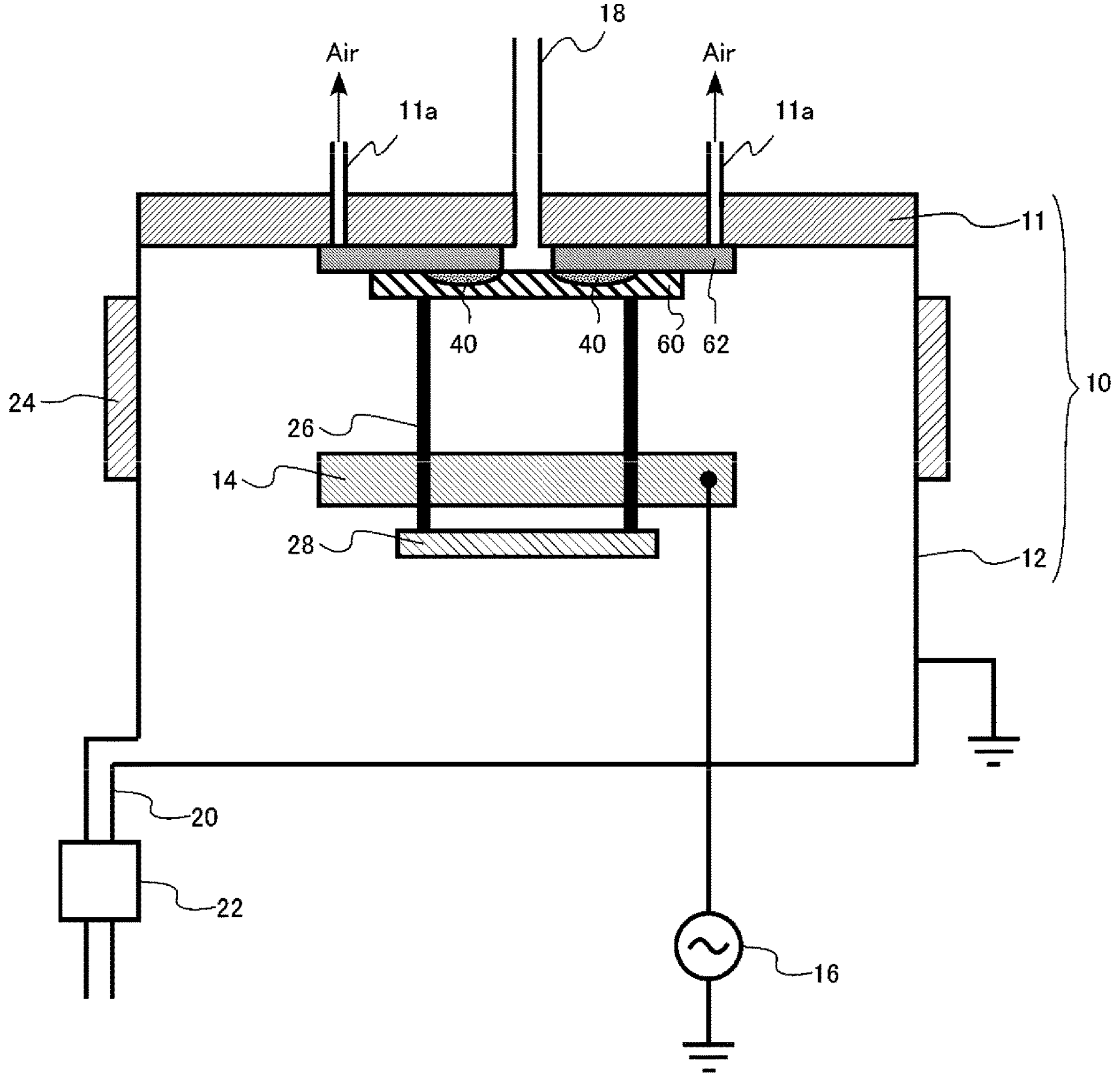
FIG. 34 is a diagram illustrating an example of the semiconductor device manufacturing method according to the third embodiment.
Figure 35:
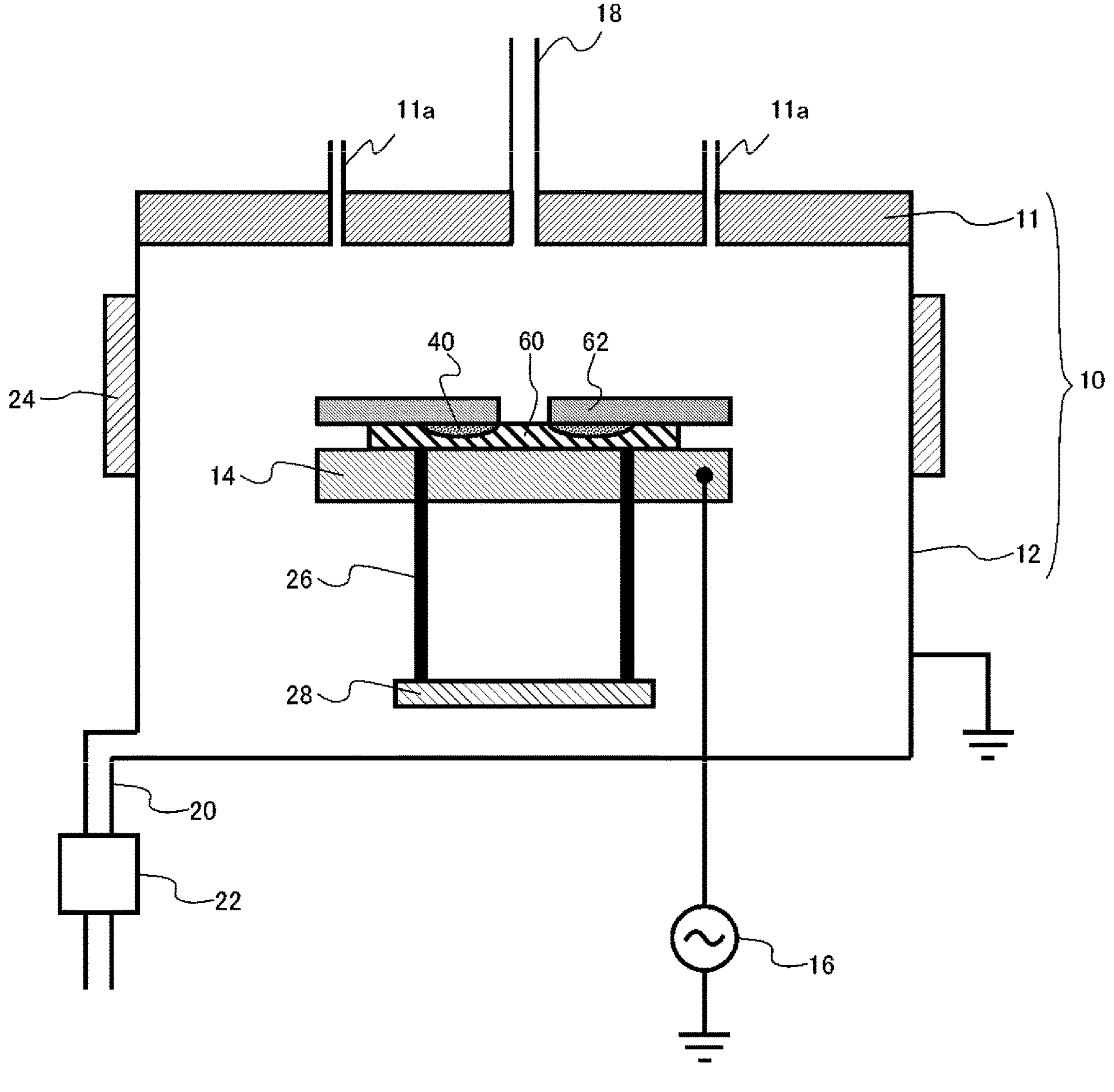
FIG. 35 is a diagram illustrating an example of the semiconductor device manufacturing method according to the third embodiment.

Subsequently, an etching process of etching the first layer is performed (see FIG. 32). For example, a methane gas ($CH_4$) and a hydrogen gas ($H_2$) are supplied as an etching gas from the gas supply pipe 18 in the chamber 10. The exhaust device 22 is operated to depressurize a pressure in the chamber 10 and maintain a predetermined pressure. For example, a gas containing fluorine (F) may also be used as the etching gas.

Subsequently, the high-frequency power source 16 applies high-frequency power to the holder 14. The high-frequency power source 16 generates plasma in the chamber 10 by the high-frequency power applied to the holder 14. Ions or radicals in the plasma collide with the semiconductor wafer W to etch the first layer.

Subsequently, the application of the high-frequency power to the holder 14 is stopped and the supply of the etching gas is stopped. The etching process ends. After the etching process ends, the semiconductor wafer W is exported outside of the chamber 10.

In the etching process, a byproduct 40 containing indium (In) is attached to the lower surface of the cover member 62. Since the lower surface of the top plate 11 is covered with the cover member 62, the byproduct 40 containing indium (In) is not attached. The byproduct 40 containing indium is, for example, an oxide. When the etching gas contains fluorine (F), the byproduct 40 containing indium is, for example, a fluoride.

For example, the importing of the semiconductor wafer W including the first layer containing indium (In) in the chamber 10, the etching of the first layer, and the exporting of the semiconductor wafer W outside of the chamber 10 are repeated a plurality of times.

Subsequently, the support substrate 60 is imported in the chamber 10. The support substrate 60 imported in the chamber 10 is placed on the holder 14 (see FIG. 33).

Subsequently, the support substrate 60 is moved in the direction orienting from the holder 14 to the top plate 11 using the lift pins 26. The support substrate 60 is lifted by the lift pins 26. The support substrate 60 is brought into contact with the cover member 62 (see FIG. 34).

Subsequently, the vacuum-drawing from the adsorption holes 11*a* provided in the top plate 11 is stopped. The cover member 62 can be isolated from the top plate.

Subsequently, the support substrate 60 and the cover member 62 are moved down using the lift pins 26. The support substrate 60 and the cover member 62 are placed on the holder 14 (see FIG. 35).

Figure 36:
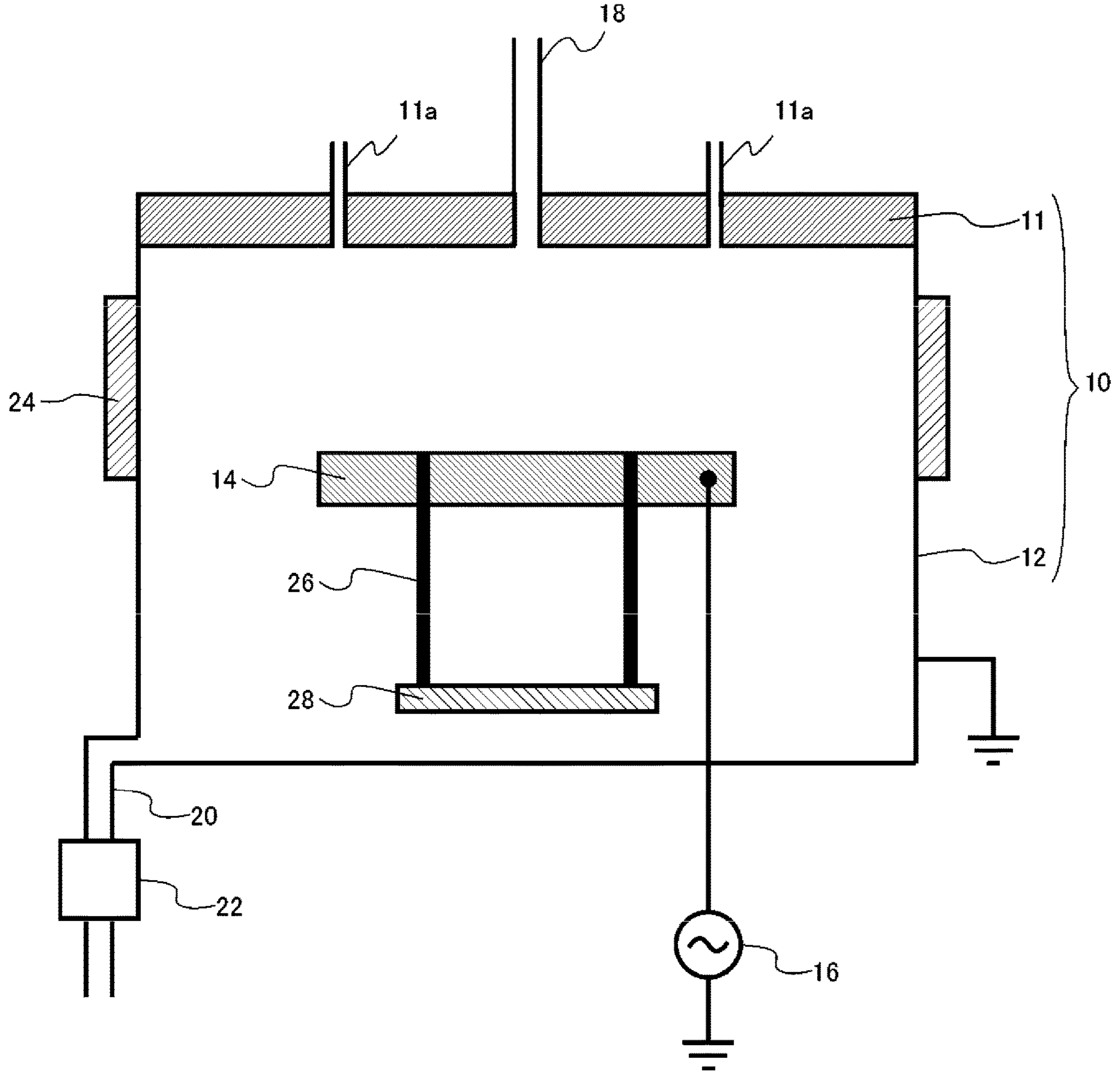
FIG. 36 is a diagram illustrating an example of the semiconductor device manufacturing method according to the third embodiment.

Subsequently, the cover member 62 to which the byproduct 40 containing indium is attached is exported outside of the chamber 10 along with the support substrate 60 (see FIG. 36).

Next, operational effects and advantages of the semiconductor manufacturing apparatus and the semiconductor device manufacturing method according to the third embodiment will be described.

For example, when a layer containing indium (In) such as an indium tin oxide layer provided in a semiconductor device is etched using the RIE apparatus, a byproduct containing indium (In) is attached to the inner surface of the chamber. The byproduct containing indium is attached to, for example, the lower surface of the top plate of the chamber.

The byproduct attached to the lower surface of the top plate of the chamber is a cause for generating, for example, particles. The particles generated in the chamber deteriorate, for example, a manufacturing yield of semiconductor devices. Accordingly, it is necessary to remove the byproduct attached to the lower surface of the top plate of the chamber periodically. That is, it is necessary to perform a cleaning process on the chamber periodically.

A vapor pressure of the byproduct containing indium is low. In other words, the byproduct containing indium rarely volatilizes. Therefore, for example, to remove the byproduct containing indium by heating, a high temperature equal to or greater than a temperature exceeding resistance of the RIE apparatus is necessary.

Accordingly, for example, a method of opening the chamber and removing the byproduct containing indium by wet etching or the like may also be conceived. However, in this case, a time necessary for the cleaning process becomes longer and a turn-around time for semiconductor device manufacturing increases. Accordingly, for example, manufacturing cost of a semiconductor device is raised.

In the semiconductor manufacturing apparatus and the semiconductor device manufacturing method according to the third embodiment, the byproduct 40 containing indium is prevented from being attached to the lower surface of the top plate 11 of the chamber 10 by covering the top plate 11 with the cover member 62. The cover member 62 can be imported in the chamber 10 and exported outside of the chamber 10 without opening the chamber 10. Therefore, the indium-containing by-product 40 can be removed without opening the chamber. Accordingly, for example, the time necessary for the cleaning process becomes shorter and the turn-around time for semiconductor device manufacturing decreases.

In the semiconductor manufacturing apparatus according to the third embodiment, from the viewpoint of reliably bringing the cover member 62 into contact with the top plate 11, the tip ends of the lift pins 26 can be preferably moved from the surface of the holder 14 to a position equal to or greater than 80% of the distance between the holder 14 and the top plate 11, and can be more preferably moved to a position equal to or greater than 90% of the distance.

In the semiconductor manufacturing apparatus according to the third embodiment, the number of lift pins 26 is preferably four or more. As the number of lift pins 26 is larger, vertical movement of the support substrate 60 and the cover member 62 is stabilized.

In the semiconductor device manufacturing method according to the third embodiment, surface roughness of the surface of the cover member 62 facing the holder 14 is preferably greater than surface roughness of the surface of the top plate 11 facing the holder 14. Since the surface roughness of the surface of the cover member 62 facing the holder 14 is greater, the byproduct 40 is easily attached to the cover member 62 and is rarely taken. Accordingly, for example, collection efficiency of the byproduct 40 by the cover member 62 is improved. For example, the byproduct 40 is inhibited from being released from the cover member 62 in the apparatus during moving the cover member 62.

In the semiconductor device manufacturing method according to the third embodiment, the cover member 62 is preferably placed and moved on the support substrate 60. For example, when the lower surface of the cover member 62 to which the byproduct 40 is attached comes into direct contact with the surface of the holder 14, there is a concern of the byproduct 40 being attached to the surface of the holder 14 and causing pollution. Further, the support substrate 60 may not be used either.

As described above, according to the semiconductor manufacturing apparatus and the semiconductor device manufacturing method according to the third embodiment, it is possible to remove the byproduct containing indium without opening the chamber.

The examples in which the semiconductor manufacturing apparatus used in the semiconductor device manufacturing method according to the first to third embodiments is the capacitively coupled plasma apparatus (CCP apparatus) have been described. A semiconductor manufacturing apparatus used in the semiconductor device manufacturing method according to an embodiment is not limited to a CCP apparatus. For example, an inductively coupled plasma apparatus (ICP apparatus) may also be used.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor manufacturing apparatus comprising:

a chamber including a top plate;

a holder provided in the chamber and configured to place a substrate;

a high-frequency power source configured to apply high-frequency power to the holder;

a gas supply pipe configured to supply a gas to the chamber;

a gas discharge pipe configured to discharge a gas from the chamber;

a plurality of lift pins configured to move the substrate in a direction away from the holder to the top plate, which allows tip ends of the lift pins to move from an upper surface of the holder to a position with a first distance, wherein the first distance is equal to or greater than about 70% of a second distance between the upper surface of the holder and the top plate; and a plurality of push pins configured to push down the substrate in a direction away from the top plate to the holder while the substrate is supported by the lift pins.

2. The semiconductor manufacturing apparatus according to claim 1, wherein the plurality of lift pins each penetrate through the holder.

3. The semiconductor manufacturing apparatus according to claim 1, wherein a number of the plurality of lift pins is equal to or greater than four.

* * * * *